United States Patent
Arimura

(10) Patent No.: US 10,756,715 B2
(45) Date of Patent: Aug. 25, 2020

(54) SIGNAL TRANSFER DEVICE

(71) Applicant: Rohm Co., Ltd., Kyoto (JP)

(72) Inventor: Masahiko Arimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/452,766

(22) Filed: Jun. 26, 2019

(65) Prior Publication Data

US 2020/0014375 A1 Jan. 9, 2020

(30) Foreign Application Priority Data

Jul. 3, 2018 (JP) .................. 2018-126606
Jul. 3, 2018 (JP) .................. 2018-126608
Jul. 3, 2018 (JP) .................. 2018-126610

(51) Int. Cl.
*H03K 5/22* (2006.01)
*H03K 5/1252* (2006.01)
*H03K 3/01* (2006.01)
*H03K 3/037* (2006.01)
*G06F 1/06* (2006.01)
*H03K 21/00* (2006.01)
(Continued)

(52) U.S. Cl.
CPC .............. *H03K 5/1252* (2013.01); *G06F 1/06* (2013.01); *G06F 1/08* (2013.01); *H03K 3/01* (2013.01); *H03K 3/037* (2013.01); *H03K 19/20* (2013.01); *H03K 21/00* (2013.01)

(58) Field of Classification Search
CPC ........ H03K 5/12; H03K 5/1252; H03K 5/132; H03K 5/135; H03K 5/1534; H03K 3/01; H03K 3/037; H03K 19/20; H03K 21/00; G06F 1/04; G06F 1/06; G06F 1/08; G06F 1/10
See application file for complete search history.

(56) References Cited

U.S. PATENT DOCUMENTS 10,382,035 B2 * 8/2019 Yanagishima .......... H03K 17/61
10,419,251 B2 * 9/2019 Strzalkowski ........ H04L 25/085
(Continued)

FOREIGN PATENT DOCUMENTS

JP    2010-010762    1/2010
JP    2014-003515    1/2014
(Continued)

*Primary Examiner* — Long Nguyen
(74) *Attorney, Agent, or Firm* — Fish & Richardson P.C.

(57) ABSTRACT

A pulse generation circuit has: an edge detector detecting a pulse edge in an input signal to generate edge detection signals; a clock generator generating a clock signal according to the edge detection signals; a frequency divider dividing the frequency of the clock signal to generate a frequency-divided clock signal; an input pad for receiving a test mode switch signal from a tester; and an output pad for outputting the frequency-divided clock signal to the tester. The edge detector can generate the edge detection signals by detecting a pulse edge not in the input signal but in the clock signal or in the inverted clock signal obtained by inverting the logic level of the clock signal when the test mode switch signal is being fed in. The signal delay time in the edge detector is adjustable according to the period of the frequency-divided clock signal as measured by the tester.

10 Claims, 18 Drawing Sheets

(51) Int. Cl.
*G06F 1/08* (2006.01)
*H03K 19/20* (2006.01)

(56) References Cited

U.S. PATENT DOCUMENTS

| | | | |
|---|---|---|---|
| 2009/0322380 A1* | 12/2009 | Yanagishima | H02M 1/08 327/73 |
| 2011/0175642 A1* | 7/2011 | Chen | H01F 17/0006 326/21 |
| 2014/0002168 A1 | 1/2014 | Yanagishima et al. | |
| 2018/0026611 A1 | 1/2018 | Ishikawa et al. | |

FOREIGN PATENT DOCUMENTS

| | | |
|---|---|---|
| JP | 2014-007502 | 1/2014 |
| JP | 2018-014549 | 1/2018 |

* cited by examiner

SIGNAL TRANSFER DEVICE

This application is based on the following Japanese patent applications, the contents of which are hereby incorporated by reference:
(1) Japanese Patent Application published as No. 2018-126606 (filed on Jul. 3, 2018)
(2) Japanese Patent Application published as No. 2018-126608 (filed on Jul. 3, 2018)
(3) Japanese Patent Application published as No. 2018-126610 (filed on Jul. 3, 2018)

BACKGROUND OF THE INVENTION

1. Field of the Invention

The invention disclosed herein relates to signal transfer devices.

2. Description of Related Art

Conventionally, signal transfer devices that transfer pulse signals while isolating between input and output are used in a variety of applications (in power supply devices, motor driving devices, and the like).

Examples of conventional technology related to what is mentioned above are seen in Japanese Patent Applications published as Nos. 2014-007502, 2018-014549, 2014-003515, and 2010-010762.

First Problem: Inconveniently, conventional signal transfer devices leave room for improvement in terms of variation of signal delay.

Second Problem: Moreover, conventional signal transfer devices leave room for improvement in terms of signal delay in a multiple transmission-reception system.

Third Problem: Moreover, conventional signal transfer devices leave room for improvement in terms of cancellation of instantaneous transient in-phase noise (what is generally called CMTI (common-mode transient immunity) noise) that occurs in either of reception pulse signals that are fed in parallel to a pulse reception circuit on the secondary side.

SUMMARY OF THE INVENTION

First Aspect of the Invention: In view of the above-mentioned first problem encountered by the present inventor, an object of a first aspect of the invention disclosed herein is to provide a signal transfer device that can suppress variation of signal delay, and to provide a pulse generation circuit for use in such a signal transfer device.

Accordingly, in one arrangement according to what is disclosed herein, a pulse generation circuit includes: an edge detector block configured to detect a pulse edge in an input signal to generate a first edge detection signal and a second edge detection signal; a clock generator block configured to generate a clock signal according to the first and second edge detection signals; a frequency divider block configured to divide the frequency of the clock signal to generate a frequency-divided clock signal; a test input pad configured to receive a test mode switch signal from a tester; and a test output pad configured to output the frequency-divided clock signal to the tester. The edge detector block is configured to have a function of generating the first and second edge detection signals by detecting a pulse edge not in the input signal but in the clock signal or in the inverted clock signal obtained by inverting the logic level of the clock signal when the test mode switch signal is being fed in. The signal delay time in the edge detector block is adjustable according to the period of the frequency-divided clock signal as measured by the tester.

Second Aspect of the Invention: In view of the above-mentioned second problem encountered by the present inventor, an object of a second aspect of the invention disclosed herein is to provide a signal transfer device that can reduce signal delay in a multiple transmission-reception system.

Accordingly, in another arrangement according to what is disclosed herein, a signal transfer device includes: a pulse generation circuit configured to generate a plurality of pulses in one of a first transmission pulse signal and a second transmission pulse signal according to the logic level of an input signal; an isolation circuit configured to transfer the first and second transmission pulse signals as a first reception pulse signal and a second reception pulse signal, respectively, while isolating between input and output; a noise cancel circuit configured to mask in-phase noise occurring in the first and second reception pulse signals to generate a first clock signal and a second clock signal; and a pulse reception circuit configured to count the numbers of pulses in the first and second clock signals, respectively, to switch the logic level of a reception pulse signal. The pulse reception circuit is configured to reset the number of pulses in the second clock signal according to the first clock signal and reset the number of pulses in the first clock signal according to the second clock signal.

Third Aspect of the Invention: In view of the above-mentioned third problem encountered by the present inventor, an object of a third aspect of the invention disclosed herein is to provide a signal transfer device that can achieve fast noise cancellation and thereby reduce signal delay, and to provide a noise cancel circuit for use in such a signal transfer device.

Accordingly, in another arrangement according to what is disclosed herein, a noise cancel circuit includes: a first reception signal generator block configured to generate a first reception signal according to a first input signal; a second reception signal generator block configured to generate a second reception signal according to a second input signal fed in in parallel with the first input signal; a first mask signal generator block configured to generate a first mask signal according to the second input signal; a second mask signal generator block configured to generate a second mask signal according to the first input signal; a first logic gate configured to perform a logical operation between the first reception signal and the first mask signal to generate a first output signal; a second logic gate configured to perform a logical operation between the second reception signal and the second mask signal to generate a second output signal; a first discharge transistor configured to discharge the first input signal by using the first mask signal; and a second discharge transistor configured to discharge the second input signal by using the second mask signal.

Other features, elements, steps, benefits, and characteristics of the present invention will become clearer with reference to the following detailed description of preferred embodiments thereof in conjunction with the accompanying drawings.

DETAILED DESCRIPTION OF PREFERRED EMBODIMENTS

Switching Power Supply

Figure 1:
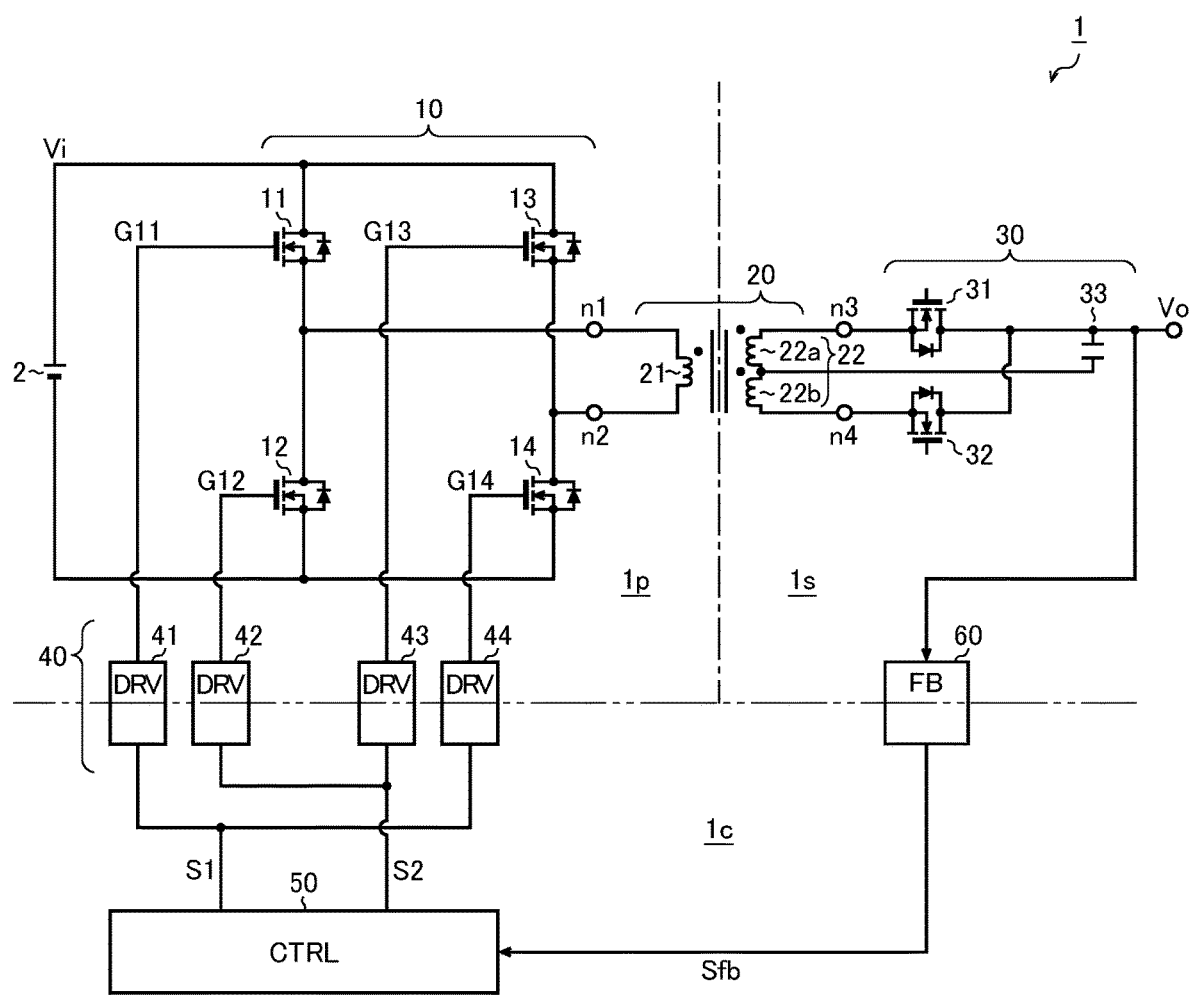
FIG. 1 is a diagram showing an overall configuration of a switching power supply.

FIG. 1 is a diagram showing the overall configuration of a switching power supply. The switching power supply 1 of this configuration example is a step-down isolated DC-DC converter that steps down a direct-current input voltage Vi from a direct-current power source 2 to produce a desired direct-current output voltage Vo while electrically isolating between a primary circuit system 1p and a secondary circuit system 1s. The switching power supply 1 includes a switching output block 10, a transformer 20, a rectifier-smoother block 30, a switching driver block 40, a switching controller block 50, and an output feedback block 60.

When the switching power supply 1 is used as an AC-DC converter, there can be separately provided a front-end circuit (such as a diode bridge and a power factor correction circuit) to produce the direct-current input voltage Vi by rectifying and smoothing an alternating-current input voltage Vac.

The switching output block 10 is provided in the primary circuit system 1p of the switching power supply 1, and includes four transistors 11 to 14 (in FIG. 1, all are NMOS-FETs) that are connected in a full bridge between the positive and negative terminals of the direct-current power source 2. Their interconnection is as follows. The drains of the transistors 11 and 13 are both connected to the positive terminal of the direct-current power source 2 (that is, the input terminal of the direct-current input voltage Vi). The source and the back gate of the transistor 11 and the drain of the transistor 12 are all connected to a node n1. The source and the back gate of the transistor 13 and the drain of the transistor 14 are all connected to a node n2. The sources and the back gates of the transistors 12 and 14 are all connected to the negative terminal of the direct-current power source 2. The transistors 11 to 14 are each accompanied, between their respective drains and sources, by a body diode with the illustrated polarity.

The gate of the transistor 11 is fed with a gate signal G11 so that the transistor 11 is turned on and off according to the logic level of the gate signal G11. Specifically, the transistor 11 is on when the gate signal G11 is at high level, and is off when the gate signal G11 is at low level.

Likewise, the gates of the transistors 12 to 14 are fed with gate signals G12 to G14 respectively so that the transistors 12 to 14 are turned on and off according to the logic levels of the gate signals G12 to G14. Specifically, the transistors 12 to 14 are respectively on when the corresponding gate signals G12 to G14 are at high level, and are off when the corresponding gate signals G12 to G14 are at low level.

For example, when the transistors 11 and 14 are on and the transistors 12 and 13 are off, a primary current flows along a current path leading from the positive terminal of the direct-current power source 2 via the transistor 11, the node n1, the primary winding 21 of the transformer 20, the node n2, and the transistor 14 to the negative terminal of the direct-current power source 2.

On the other hand, when the transistors 11 and 14 are off and the transistors 12 and 13 are on, a primary current flows along a current path leading from the positive terminal of the direct-current power source 2 via the transistor 13, the node n2, the primary winding 21 of the transformer 20, the node n1, and the transistor 12 to the negative terminal of the direct-current power source 2.

Used as the transistors 11 to 14 are, preferably, devices that can be driven to switch at high speed (for example, Si-MOSFETs, SiC-MOSFETs, or IGBTs). Using such devices allows the driving frequency fsw of the switching output block 10 to be set at 100 kHz or higher (for example, 100 kHz to 250 kHz). It should be noted that, the higher the driving frequency fsw, the more consideration needs to be given to suppressing the signal delay and its variation in the switching driver block 40.

The transformer 20 includes a primary winding 21, which is provided in the primary circuit system 1p of the switching power supply 1, and a secondary winding 22, which is provided in the secondary circuit system 1s of the switching power supply 1 and which is magnetically coupled with the primary winding 21 (the secondary winding 22 being understood as secondary windings 22a and 22b connected in series).

The first tap (winding start terminal) of the primary winding 21 is connected to the node n1. The second tap (winding end terminal) of the primary winding 21 is connected to the node n2.

The first tap of the secondary winding 22 (the winding start terminal of the secondary winding 22a) is connected to a node n3. The second tap of the secondary winding 22 (the winding end terminal of the secondary windings 22b) is connected to node n4.

The rectifier-smoother block 30 is provided in the secondary circuit system 1s of the switching power supply 1, and includes transistors 31 and 32 (in FIG. 1, both are NMOSFETs) and a capacitor 33. Their interconnection is as follows. The source and the back gate of the transistor 31 are both connected to the node n3. The source and the back gate of the transistor 32 are both connected to the node n4. The drains of the transistors 31 and 32 and the first terminal of the capacitor 33 are all connected to the output terminal of the direct-current output voltage Vo. The second terminal of the capacitor 33 is connected to the center tap of the secondary winding 22 (that is, the connection node between the winding end terminal of the secondary winding 22a and the winding start terminal of the secondary windings 22b). The transistors 31 and 32 are each accompanied, between their respective drains and sources, by a body diode with the illustrated polarity. Used as the transistors 31 and 32, like the transistors 11 to 14, are, preferably, devices that can be driven to switch at high speed (for example, Si-MOSFETs, SiC-MOSFETs, or IGBTs).

Configured as described above, the rectifier-smoother block 30 applies full-wave rectification and smoothing to the induced voltage that appears in the secondary winding 22, and thereby produces the direct-current output voltage Vo. Instead of the transistors 31 and 32, rectifying diodes (for example, those with a low forward voltage drop, such as Schottky barrier diodes) can be used.

The switching driver block 40 includes a switching controller block 50, which is provided in a control circuit system 1c of the switching power supply 1, and isolated gate drivers 41 to 44 (corresponding to isolated signal transfer devices) as a means for transferring switching drive signals (gate signals G11 to G14 according to control signals S1 and S2) from the switching controller block 50 to the switching output block 10 while maintaining isolation from the switching output block 10 provided in the primary circuit system 1p of the switching power supply 1.

The isolated gate driver 41 transfers, as the gate signal G11, a control signal S1 from the switching controller block 50 to the gate of the transistor 11. The isolated gate driver 42 transfers, as the gate signal G12, a control signal S2 from the switching controller block 50 to the gate of the transistor 12. The isolated gate driver 43 transfers, as the gate signal G13, the control signal S2 from the switching controller block 50 to the gate of the transistor 13. The isolated gate driver 44 transfers, as the gate signal G14, the control signal S1 from the switching controller block 50 to the gate of the transistor 14. Thus, the isolated gate drivers 41 to 44 are provided one between the switching controller block 50 and the gate of each of the transistors 11 to 14.

In a case where the transistors 31 and 32 are driven to switch by use of the switching controller block 50, though not illustrated in FIG. 1, isolated gate drivers can be provided also one between the switching controller block 50 and the gate of each of the transistors 31 and 32.

The switching controller block 50 is provided in the control circuit system 1c of the switching power supply 1. The switching controller block 50 generates, according to a feedback signal Sfb from the output feedback block 60, the control signals S1 and S2 such that the direct-current output voltage Vo remains at a desired target value. For the output feedback control performed by the switching controller block 50, any well-known technique (such as voltage mode control, current mode control, or hysteresis control) can be applied, and therefore no detailed description will be given.

The output feedback block 60 generates a feedback signal Sfb commensurate with the direct-current output voltage Vo and outputs it to the switching controller block 50 while maintaining isolation between the secondary circuit system is and the control circuit system 1c of the switching power supply 1. The output feedback block 60 may have any circuit configuration, common examples including one employing a shunt regulator with a photocoupler and one employing an auxiliary winding of the transformer 20.

Figure 2:
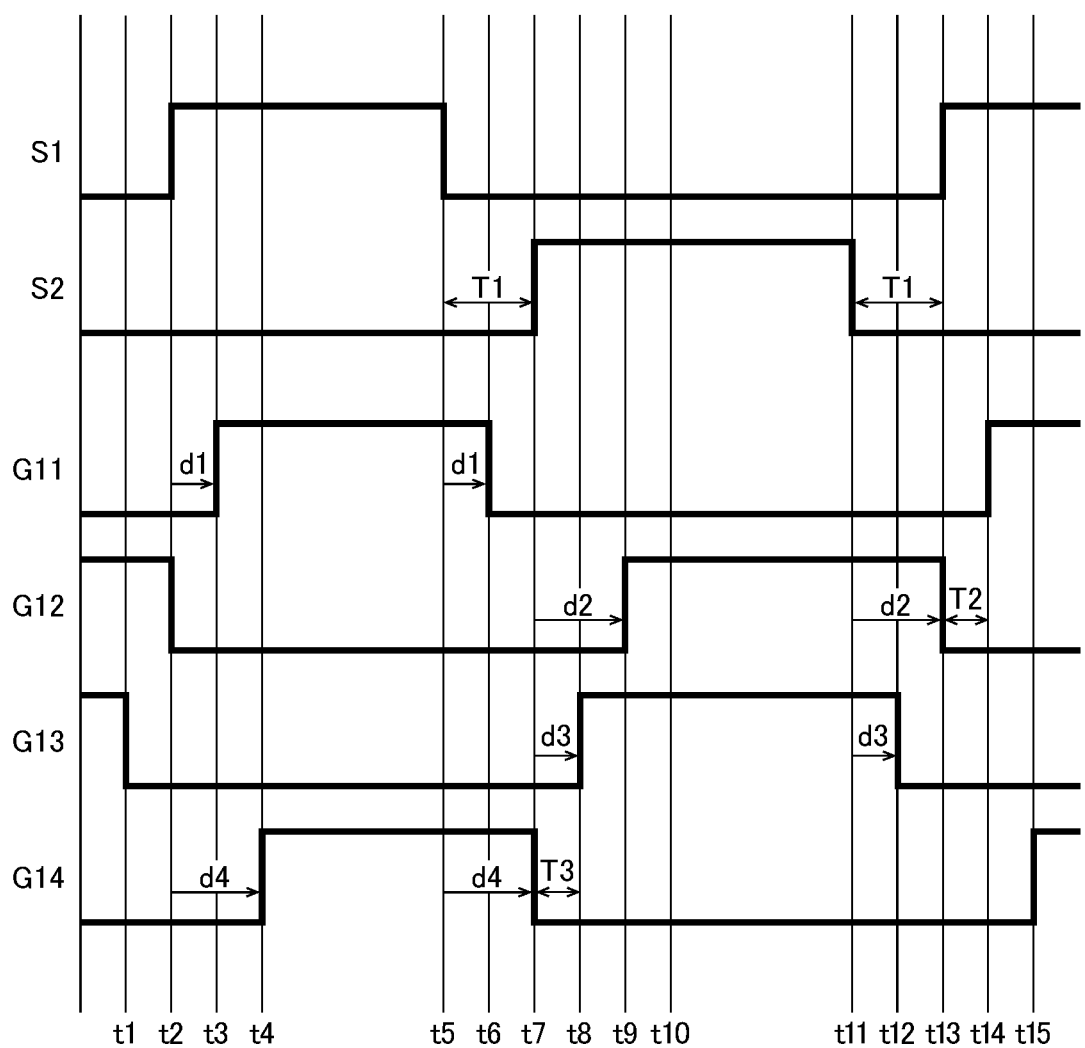
FIG. 2 is a timing chart showing one example of switching operation.

FIG. 2 is a timing chart showing one example of switching operation in the switching power supply 1, depicting, from top down, the control signals S1 and S2 and the gate signals G11 to G14.

As shown in FIG. 2, the control signal S1 is raised to high level at time point t2, is dropped to low level at time point t5, and is raised back to high level at time point t13. On the other hand, the control signal S2 is raised to high level at time point t7, and is dropped to low level at time point t11.

Thus, in the switching controller block 50, after the control signal S1 is dropped to low level until the control signal S2 is raised to high level, a predetermined dead time T1 (the time interval from t5 to t7) is secured. Likewise, in the switching controller block 50, also after the control signal S2 is dropped to low level until the control signal S1 is raised to high level, a dead time T1 (the time interval from t11 to t13) similar to the one just mentioned is secured.

The dead time T1 is secured to prevent the flow of an excessively high through-current that results from the transistors 11 and 12, or the transistors 13 and 14, turning on simultaneously (and thereby to prevent the destruction of the transistors 11 to 14).

The dead time T1 has to be set with consideration given to the variation of the signal delay among the isolated gate drivers 41 to 44. The reason will now be explained in detail with reference to the relevant drawing.

In FIG. 2, the gate signal G11 is raised to high level at time point t3, is dropped to low level at time point t6, and is raised back to high level at time point t14. Thus, the time point of the rise of the gate signal G11 is delayed from the time point of the rise of the control signal S1 by a delay time d1 (see, for example, the time interval from t2 to t3). Also, the time point of the fall of the gate signal G11 is delayed from the time point of the fall of the control signal S1 by the delay time d1 (see, for example, the time interval from t5 to t6).

On the other hand, the gate signal G12 is dropped to low level at time point t2, is raised to high level at time point t9, and is dropped back to low level at time point t13. That is, the time point of the rise of the gate signal G12 is delayed from the time point of the rise of the control signal S2 by a delay time d2 (see, for example, the time interval from t7 to t9). Also, the time point of the fall of the gate signal G12 is delayed from the time point of the fall of the control signal S2 by the delay time d2 (see, for example, the time interval from t11 to t13).

Here, if the signal delay in the isolated gate drivers 41 and 42 varies, the delay times d1 and d2 vary as well. Consider, for example, a case where d1<d2 as shown in FIG. 2. In this case, the dead time T2 (see, for example, the time interval from t13 to t14) after the gate signal G12 is dropped to low level until the gate signal G11 is raised to high level is shorter than the dead time T1 after the control signal S2 is dropped to low level until the control signal S1 is raised to high level. This makes the transistors 11 and 12 more likely to turn on simultaneously.

In a case where d1>d2 as opposed to what is shown in FIG. 2, the dead time after the gate signal G11 is dropped to low level until the gate signal G12 is raised to high level is shorter. This too makes the transistors 11 and 12 more likely to turn on simultaneously.

What has just been described is true also with the gate signals G13 and G14. As shown in FIG. 2, the gate signal G13 is dropped to low level at time point t1, is raised to high level at time point t8, and is dropped back to low level at time point t12. Thus, the time point of the rise of the gate signal G13 is delayed from the time point of the rise of the control signal S2 by a delay time d3 (see, for example, the time interval from t7 to t8). Also, the time point of the fall of the gate signal G13 is delayed from the time point of the fall of the control signal S2 by the delay time d3 (see, for example, the time interval from t11 to t12).

On the other hand, the gate signal G14 is raised to high level at time point t4, is dropped to low level at time point t7, and is raised back to high level at time point t15. That is, the time point of the rise of the gate signal G14 is delayed from the time point of the rise of the control signal S1 by a delay time d4 (see, for example, the time interval from t2 to t4). Also, the time point of the fall of the gate signal G14 is delayed from the time point of the fall of the control signal S1 by the delay time d4 (see, for example, the time interval from t5 to t7).

Here, if the signal delay in the isolated gate drivers 43 and 44 varies, the delay times d3 and d4 vary as well. Consider, for example, a case where d3<d4 as shown in FIG. 2. In this case, the dead time T3 (see, for example, the time interval from t7 to t8) after the gate signal G14 is dropped to low level until the gate signal G13 is raised to high level is shorter than the dead time T1 after the control signal S1 is dropped to low level until the control signal S2 is raised to high level. This makes the transistors 13 and 14 more likely to turn on simultaneously.

In a case where d3>d4 as opposed to what is shown in FIG. 2, the dead time after the gate signal G13 is dropped to low level until the gate signal G14 is raised to high level is shorter. This too makes the transistors 13 and 14 more likely to turn on simultaneously.

As will be understood from what has been discussed above, with consideration given to the signal delay (and its variation) in the isolated gate drivers 41 to 44, the dead time T1 needs to be set slightly longer than it theoretically is. However, the longer the dead time T1, the lower the effective duty of the switching output block 10, leading to lower performance of the switching power supply 1.

To put it another way, reducing the signal delay (and its variation) in the isolated gate drivers 41 to 44 makes it possible to reduce the dead time T1, and it is then possible to increase the effective duty and enhance the performance of the switching power supply 1.

Signal Transfer Device (First Embodiment)

Figure 3:
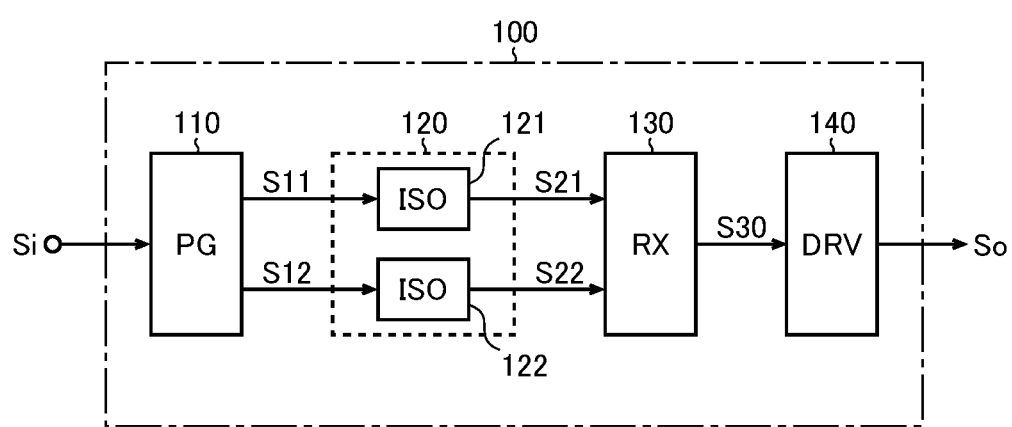
FIG. 3 is a diagram showing a first embodiment of a signal transfer device.

FIG. 3 is a diagram showing a first embodiment of a signal transfer device that can be used as, for example, the isolated gate drivers 41 to 44. The signal transfer device 100 of this embodiment includes a pulse generation circuit 110, an isolation circuit 120, a pulse reception circuit 130, and an output drive circuit 140.

The pulse generation circuit 110 generates transmission pulse signals S11 and S12 according to an input signal Si. More specifically, the pulse generation circuit 110, when notifying that the input signal Si is at high level, pulse-drives the transmission pulse signal S11 (outputs as the transmission pulse signal S11 a single pulse or several pulses) and, when notifying that the input signal Si is at low level, pulse-drives the transmission pulse signal S12 (outputs as the transmission pulse signal S12 a single pulse or several pulses). That is, the pulse generation circuit 110 pulse-drives one of the transmission pulse signals S11 and S12 according to the logic level of the input signal Si.

When the signal transfer device 100 is used as the isolated gate drivers 41 and 44, it is fed with, as the input signal Si, the control signal S1. By contrast, when the signal transfer device 100 is used as the isolated gate drivers 42 and 43, it is fed with, as the input signal Si, the control signal S2.

The isolation circuit 120 transfers the transmission pulse signals S11 and S12, as reception pulse signals S21 and S22 respectively, to the pulse reception circuit 130 while isolating between input and output by using isolating elements 121 and 122 such as transformers.

The pulse reception circuit 130 generates a reception pulse signal S30 according to the reception pulse signals S21 and S22. More specifically, the pulse reception circuit 130, in response to the reception pulse signal S21 being pulse-driven, raises the reception pulse signal S30 to high level and, in response to the reception pulse signal S22 being pulse-driven, drops the reception pulse signal S30 to low level. That is, the pulse reception circuit 130 switches the logic level of the reception pulse signal S30 according to the logic level of the input signal Si.

The output drive circuit 140 generates an output signal So according to the reception pulse signal S30 fed from the pulse reception circuit 130. More specifically, the reception pulse signal S30, when the reception pulse signal S30 is at high level, keeps the output signal So at high level and, when the reception pulse signal S30 is at low level, keeps the output signal So at low level.

In a case where the signal transfer device 100 is used as the isolated gate driver 41, it outputs, as the output signal So, the gate signal G11. Likewise, when the signal transfer device 100 is used as the isolated gate drivers 42 to 44, it outputs, as the output signal So, the gate signals G12 to G14 respectively.

In the signal transfer device 100 configured as described above, the variation of the signal delay in each of the blocks 110 to 140 provided between input and output accumulates to constitute the variation of the signal delay in the entire signal transfer device 100. In particular, the variation of the signal delay in the pulse generation circuit 110 greatly affects the variation of the signal delay in the entire signal transfer device 100.

Pulse Generation Circuit

Figure 4:
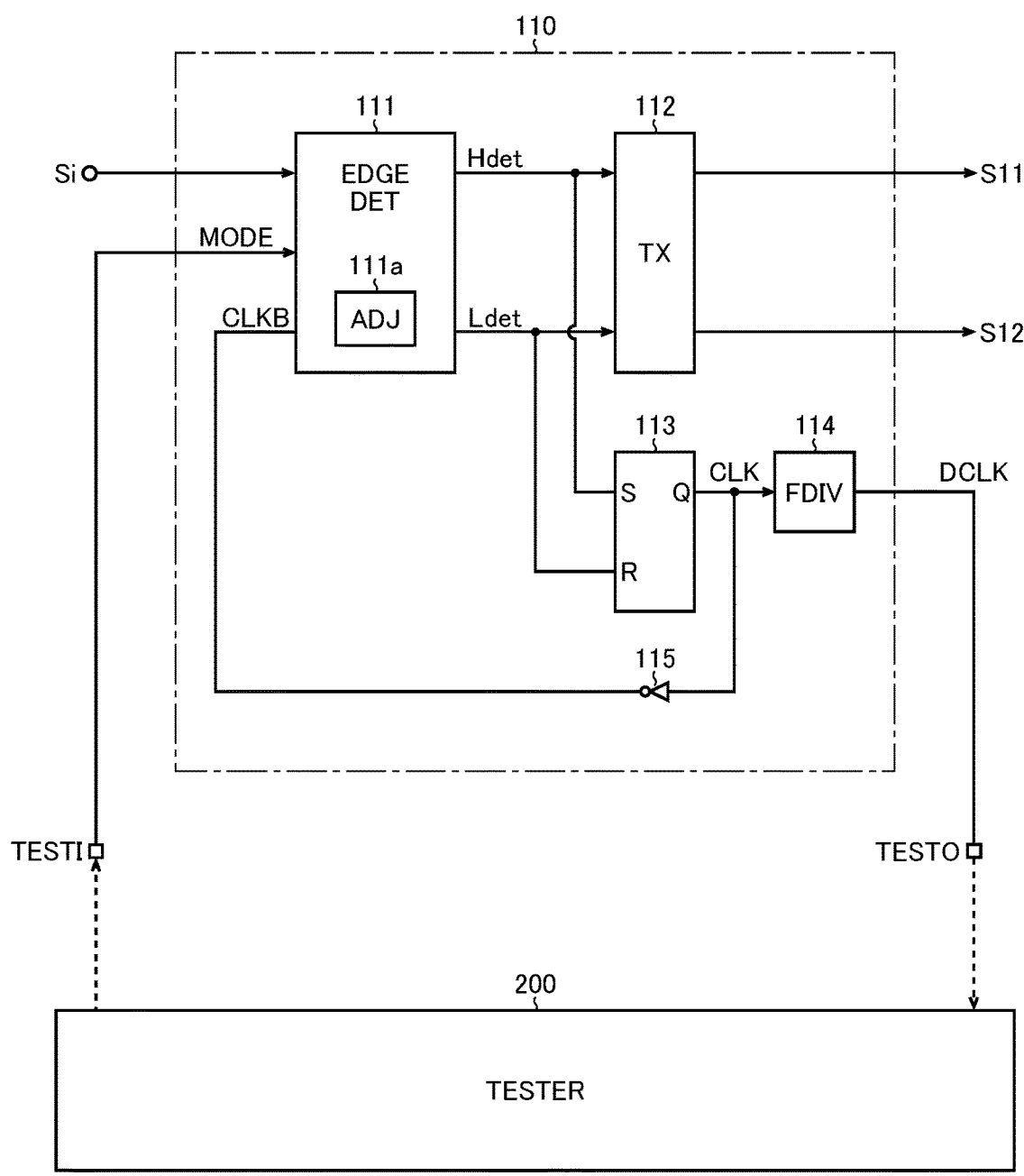
FIG. 4 is a diagram showing one configuration example of a pulse generation circuit.

FIG. 4 is a diagram showing one configuration example of the pulse generation circuit 110. The pulse generation circuit 110 of this configuration example includes an edge detector block 111, a transmitter block 112, a clock generator block 113, a frequency divider block 114, an inverter 115, a test input pad TESTI, and a test output pad TESTO.

In a regular mode (for example, MODE=L), the edge detector block 111 detects a pulse edge in the input signal Si to generate edge detection signals Hdet and Ldet. More specifically, the edge detector block 111, on detecting a rising edge in the input signal Si, generates a pulse in the edge detection signal Hdet and, on detecting a falling edge in the input signal Si, generates a pulse in the edge detection signal Ldet.

The edge detector block 111 also has the following function (self-excited oscillation function): in a test mode (for example, MODE=H), it generates the edge detection signals Hdet and Ldet by detecting a pulse edge in, not the input signal Si, but a clock signal CLK (in FIG. 4, an inverted clock signal CLKB obtained by inverting its logic level).

The edge detector block 111 further includes, as a means for adjusting the signal delay time in it, a delay adjuster 111a. The delay adjuster 111a can adjust the signal delay time of the edge detector block 111 by a well-known method (such as laser trimming).

The transmitter block 112 pulse-drives the transmission pulse signals S11 and S12 according to the edge detection signals Hdet and Ldet. Specifically, when a pulse is generated in the edge detection signal Hdet, the transmitter block 112 pulse-drives the transmission pulse signal S11, and when a pulse is generated in the edge detection signal Ldet, the transmitter block 112 pulse-drives the transmission pulse signal S12.

The clock generator block 113 generates the clock signal CLK according to the edge detection signals Hdet and Ldet. As the clock generator block 113, an RS flip-flop as shown in FIG. 4 can be suitably used. For example, when the edge detection signal Hdet is fed to the set terminal (S) and the edge detection signal Ldet is fed to the reset terminal (R), then the clock signal CLK output from the output terminal (Q) is set to high level at a rising edge in the edge detection signal Hdet and is reset to low level at a rising edge in the edge detection signal Ldet.

The frequency divider block 114 divides the frequency of the clock signal CLK, which has a period of the order of nanoseconds, and thereby generates a frequency-divided clock signal DCLK with a period of several tens of microseconds.

The inverter 115 inverts the logic level of the clock signal CLK, thereby generates the inverted clock signal CLKB, and then feeds it to the edge detector block 111.

The test input pad TESTI is an external pad for accepting a test mode switch signal MODE from a tester 200 to deliver it to the edge detector block 111. The test mode switch signal MODE is kept at low level to keep the pulse generation circuit 110 in the regular mode, and is kept at high level to keep the pulse generation circuit 110 in the test mode.

The test output pad TESTO is an external pad for outputting the frequency-divided clock signal DCLK from the frequency divider block 114 to the tester 200.

As described above, the pulse generation circuit 110 has a self diagnosis function (what is generally called a BIST (built-in self test) function) whereby the pulse generation circuit 110, according to the test mode switch signal MODE, fine-adjusts the variation of the signal delay in it through accurate measurement using the tester 200.

The self diagnosis function mentioned above does not operate in the regular mode (MODE=L), and thus does not affect the regular operation of the pulse generation circuit 110.

Figure 5:
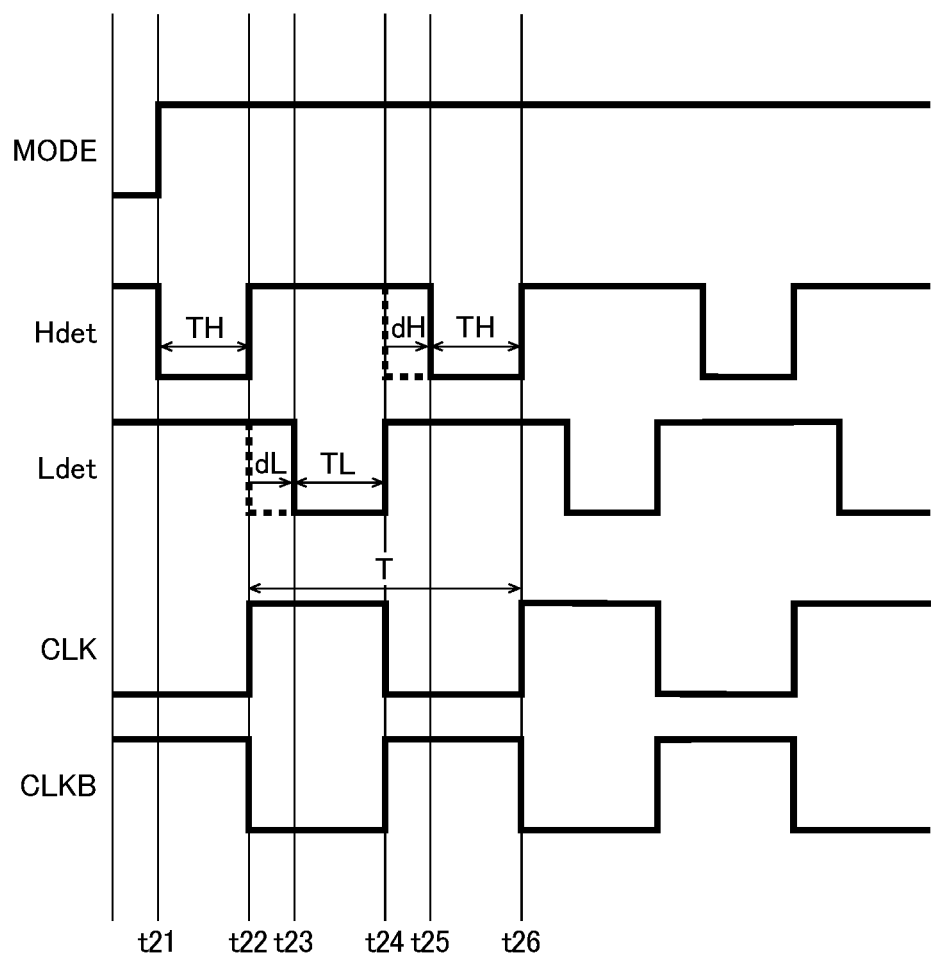
FIG. 5 is a timing chart showing one example of self-exciting oscillation operation in a test mode.

FIG. 5 is a timing chart showing one example of self-exciting oscillation operation in the test mode of the pulse generation circuit 110, depicting, from top down, the test mode switch signal MODE, the edge detection signals Hdet and Ldet, the clock signal CLK, and the inverted clock signal CLKB.

At time point t21, when the test mode switch signal MODE is raised to high level (the logic level that initiates the test mode), the edge detector block 111 starts to generate the edge detection signals Hdet and Ldet by detecting a pulse edge, not in the input signal Si, but in the inverted clock signal CLKB as described above. Specifically, when MODE=H, the inverted clock signal CLKB is at high level; thus, regarding it as a rising edge, the edge detector block 111 drops the edge detection signal Hdet to low level.

Thereafter, after the lapse of a predetermined standby time TH, at time point t22, the edge detection signal Hdet is raised back to high level. As a result, the clock signal CLK is set to high level, and thus the inverted clock signal CLKB falls to low level.

At this time, the edge detector block 111 detects the falling edge in the inverted clock signal CLKB. Accordingly, if the edge detector block 111 produces no signal delay, the edge detection signal Ldet should be dropped to low level without delay. However, in reality, the edge detector block 111 produces a signal delay. Accordingly, the edge detection signal Ldet is not dropped to low level at time point t22; only at the lapse of a signal delay time dL thereafter, that is, at time point t23, is the edge detection signal Ldet dropped to low level.

After the lapse of a predetermined standby time TL thereafter, at time point t24, the edge detection signal Ldet is raised back to high level. As a result the clock signal CLK is reset to low level, and thus the inverted clock signal CLKB rises to high level.

At this time, the edge detector block 111 detects the rising edge in the inverted clock signal CLKB. Accordingly, if the edge detector block 111 produces no signal delay, the edge detection signal Hdet should be dropped to low level without delay. However, in reality, the edge detector block 111 produces a signal delay. Accordingly, the edge detection signal Hdet is not dropped to low level at time point t24; only after the lapse of a signal delay time dH thereafter, that is, at time point t25, is the edge detection signal Hdet dropped to low level.

After the lapse of a predetermined standby time TH thereafter, at time point t26, the edge detection signal Ldet is raised back to high level. As a result, the clock signal CLK is reset to low level, and thus the inverted clock signal CLKB rises to high level.

After time point t26, operation similar to that described above is repeated, so that the self-exciting oscillation operation of the clock signal CLK continues.

Here, as shown in FIG. 5, the period T of the clock signal CLK includes the signal delay times dH and dL in the edge detector block 111. Thus, the longer the signal delay times dH and dL, the longer the period; the shorter the signal delay times dH and dL, the shorter the period.

Thus, by measuring the period T of the clock signal CLK by use of the tester 200 and fine-adjusting the signal delay times dH and dL in the edge detector block 111 based on the measured value, it is possible to suppress the variation of the signal delay in the pulse generation circuit 110 (and hence the variation of the signal delay in the signal transfer device 100).

It is preferable that the delay adjuster 111*a* in the edge detector block 111 fine-tune the signal delay times dH and dL such that the measured value of the period T equals the middle value of the permissible range of variation.

The pulse generation circuit 110 does not feed the clock signal CLK, which has a period T of the order of nanoseconds, as it is to the tester 200, but feeds it to the tester 200 after dividing its frequency and thereby converting it into a frequency-divided clock signal DCLK with a period m×T of several tens of microseconds. Thus, the tester 200 can accurately measure the period m×T of the frequency-divided clock signal DCLK (and hence the period T of the clock signal CLK), and this makes it possible to accurately adjust the signal delay times dH and dL.

In particular, in the switching power supply 1, which requires high-speed switching of the transistors 11 to 14, suppressing the variation of the signal delay in the signal transfer device 100 permits the previously mentioned dead time T1 to be set at its minimum necessary. This increases the effective duty of the switching output block 10, and thus enhances the performance of the switching power supply 1.

Package

Figure 6:
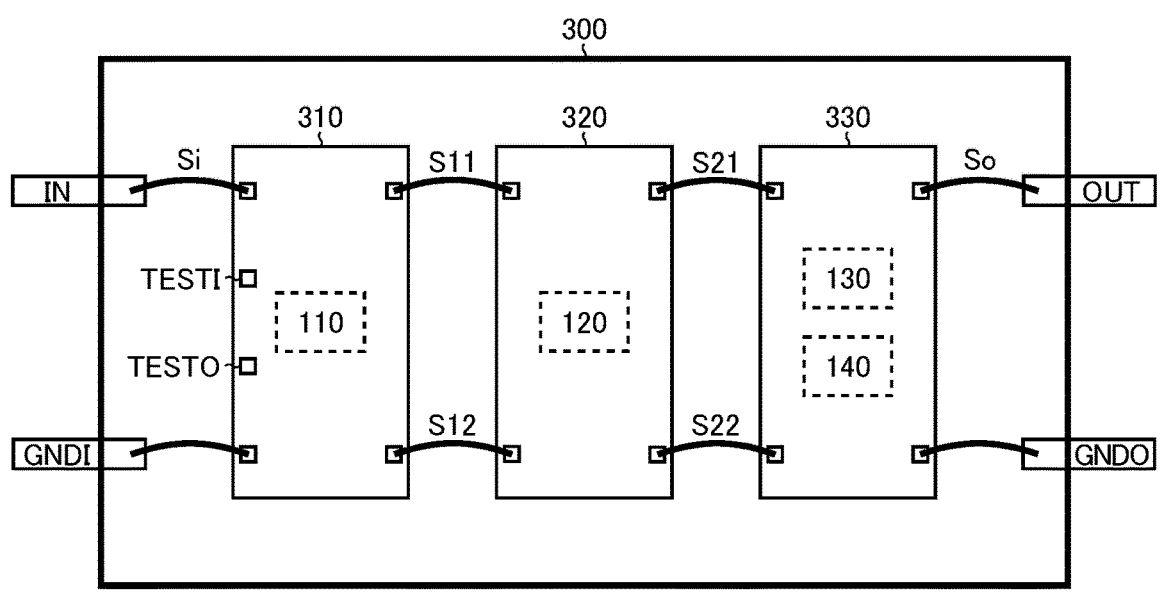
FIG. 6 is a diagram showing one example of a package.

FIG. 6 is a diagram showing one example of the package used for the signal transfer device 100. The package 300 in the diagram is adapted to the mounting of multiple chips on it, and in the illustrated example, a semiconductor chip 310 having the pulse generation circuit 110 integrated on it, a semiconductor chip 320 having the isolation circuit 120 integrated on it, and a semiconductor chip 330 having the pulse reception circuit 130 and the output drive circuit 140 integrated on it are sealed in a single package 300.

The test input pad TESTI and the test output pad TESTO, which are provided on the semiconductor chip 310, are, as mentioned previously, test pads that are used only when the pulse generation circuit 110 is operating in the test mode, and thus do not need to be led out of the package 300. Accordingly, these test pads can be sealed in the package 300 without being bonded to any lead frames.

Signal Transfer Device (Second Embodiment)

Figure 7:
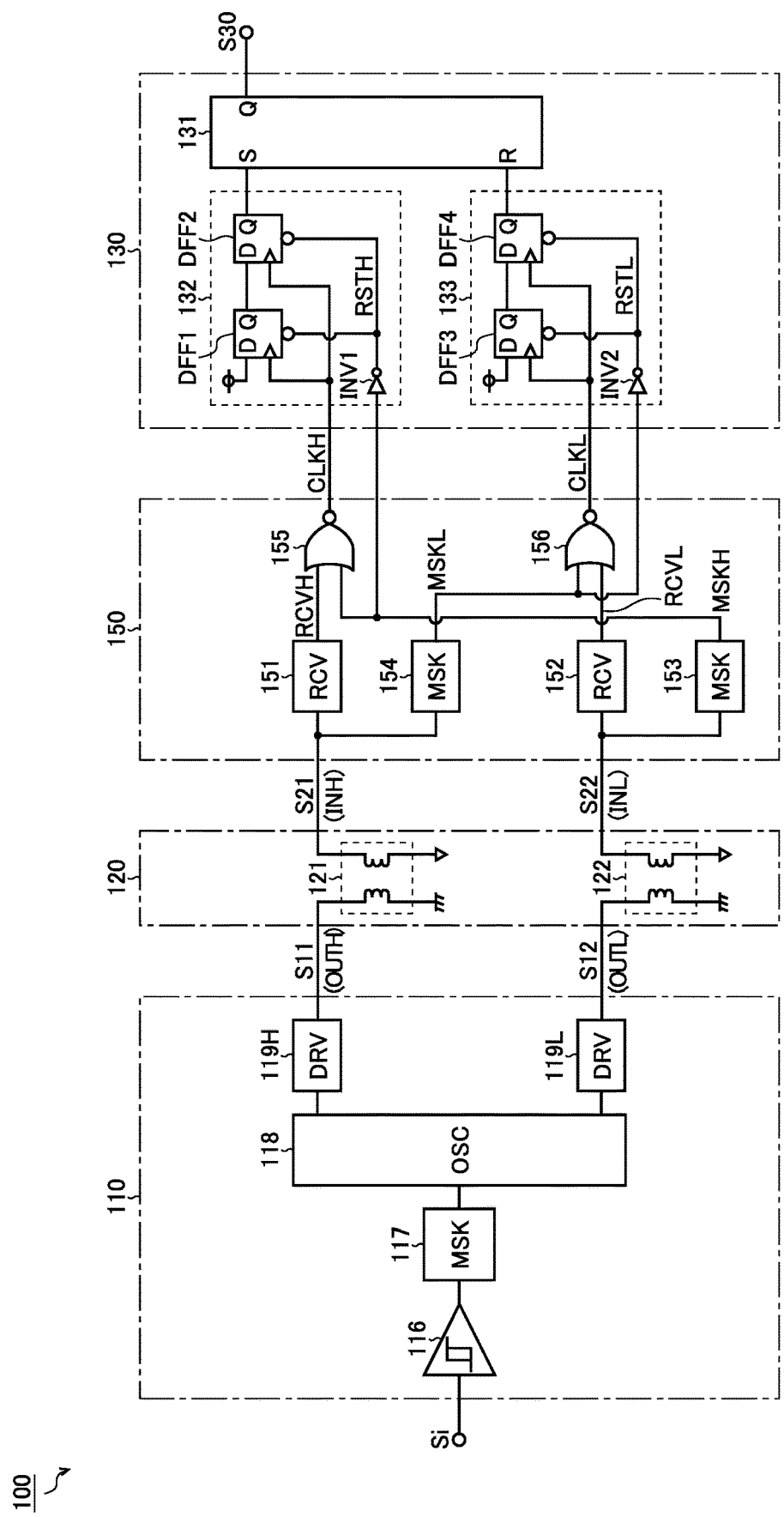
FIG. 7 is a diagram showing a second embodiment of a signal transfer device.

FIG. 7 is a diagram showing a second embodiment of the signal transfer device 100. The signal transfer device 100 of this embodiment, while being based on the first embodiment (FIG. 3) described previously, has the pulse generation circuit 110, the isolation circuit 120, and the pulse reception circuit 130 implemented with specific circuit configurations respectively as a means for achieving signal transfer in a multiple transmission-reception system. It should be noted that such a signal transfer device 100 for a multiple transmission-reception system does not necessarily presuppose application to the isolated gate drivers 41 to 44.

Moreover, in the signal transfer device 100 of this embodiment, a noise cancel circuit 150 is provided between the isolation circuit 120 and the pulse reception circuit 130. In the diagram, the output drive circuit 140 is omitted from illustration, and whether to include or omit it is of free choice. Now, each circuit block will be described in detail.

The pulse generation circuit 110 includes a Schmitt trigger 116, an input noise masking block 117, an oscillator 118, and drivers 119H and 119L. The pulse generation circuit 110 generates a plurality of pulses in one of the transmission pulse signals S11 and S12 according to the logic level of the input signal Si.

The Schmitt trigger 116 is a buffer or an inverter of which the output level varies with predetermined hysteresis according to the input signal Si.

The input noise masking block 117 masks noise components in the input signal Si which is transferred via the Schmitt trigger 116. As the input noise masking block 117, for example, a low-pass filter or the like can be used suitably.

The oscillator 118 feeds a drive pulse signal with a predetermined frequency to one of the drivers 119H and 119L according to the logic level of the input signal Si transferred via the input noise masking block 117. More specifically, during the high-level period of the input signal Si, the oscillator 118 feeds the driver 119H with a drive pulse signal with a predetermined frequency and, during the low-level period of the input signal Si, the oscillator 118 feeds the driver 119L with a drive pulse signal with a predetermined frequency.

The driver 119H pulse-drives the transmission pulse signal S11 (that is, an output pulse signal OUTH) according to the drive pulse signal from the oscillator 118. That is, when the input signal Si is at high level, a plurality of pulses are generated periodically in the transmission pulse signal S11.

The driver 119L pulse-drives the transmission pulse signal S12 (that is, an output pulse signal OUTL) according to the drive pulse signal from the oscillator 118. That is, when the input signal Si is at low level, a plurality of pulses are generated periodically in the transmission pulse signal S12.

The isolation circuit 120 transfers the transmission pulse signals S11 and S12, as the reception pulse signals S21 and S22 respectively, to the noise cancel circuit 150 while isolating between input and output by use of isolating elements 121 and 122 such as transformers.

The noise cancel circuit 150 receives, as input signals INH and INL respectively, the reception pulse signals S21 and S22 fed to it in parallel from the isolating elements 121 and 122, and masks instantaneous transient in-phase noise (what is generally called CMTI (common-mode transient immunity) noise; hereinafter referred to simply as in-phase noise) that occurs in each of those signals, thereby to generate clock signals CLKH and CLKL (corresponding to the reception pulse signals having undergone noise cancellation), which the noise cancel circuit 150 then feeds to the pulse reception circuit 130. The noise cancel circuit 150 includes, as components constituting it, reception signal generator blocks 151 and 152, mask signal generator blocks 153 and 154, and NOR gates 155 and 156.

The reception signal generator block 151 generates a reception signal RCVH according to an input signal INH. Specifically, when the input signal INH rises to high level, the reception signal generator block 151 generates a reception signal RCVH with a predetermined pulse width W1. In this embodiment, the reception signal RCVH is the logically inverted signal of the input signal INH.

The reception signal generator block 152 generates a reception signal RCVL according to an input signal INL. Specifically, when the input signal INL rises to high level, the reception signal generator block 152 generates a reception signal RCVL with a predetermined pulse width W1. In this embodiment, the reception signal RCVL is the logically inverted signal of the input signal INL.

Through wave-shaping in the reception signal generator blocks 151 and 152 described above, even if the input signals INH and INL have a very narrow pulse width, it is possible to reliably perform pulse reception in the pulse reception circuit 130 (that is, pulse counting in counters 132 and 133, and hence setting and resetting of an RS flip-flop 131).

The mask signal generator block 153 generates a mask signal MSKH according to the input signal INL. Specifically, when the input signal INL rises to high level, the mask signal generator block 153 generates a mask signal MSKH with a pulse width W2 larger than the pulse width W1.

The mask signal generator block 154 generates a mask signal MSKL according to the input signal INH. Specifically, when the input signal INH rises to high level, the mask signal generator block 154 generates a mask signal MSKL with the pulse width W2 larger than the pulse width W1.

The NOR gate 155 generates a clock signal CLKH by taking the NOR (negative OR) between the reception signal RCVH and the mask signal MSKH. Accordingly, when the mask signal MSKH is at low level, the logically inverted signal of the reception signal RCVH is output as the clock signal CLKH. By contrast, when the mask signal MSKH is at high level, irrespective of the logic level of the reception signal RCVH, the clock signal CLKH is held at low level.

The NOR gate 156 generates a clock signal CLKL by taking the NOR (negative OR) between the reception signal RCVL and the mask signal MSKL. Accordingly, when the mask signal MSKL is at low level, the logically inverted signal of the reception signal RCVL is output as the clock signal CLKL. By contrast, when the mask signal MSKL is at high level, irrespective of the logic level of the reception signal RCVL, the clock signal CLKL is held at low level.

Figure 8:
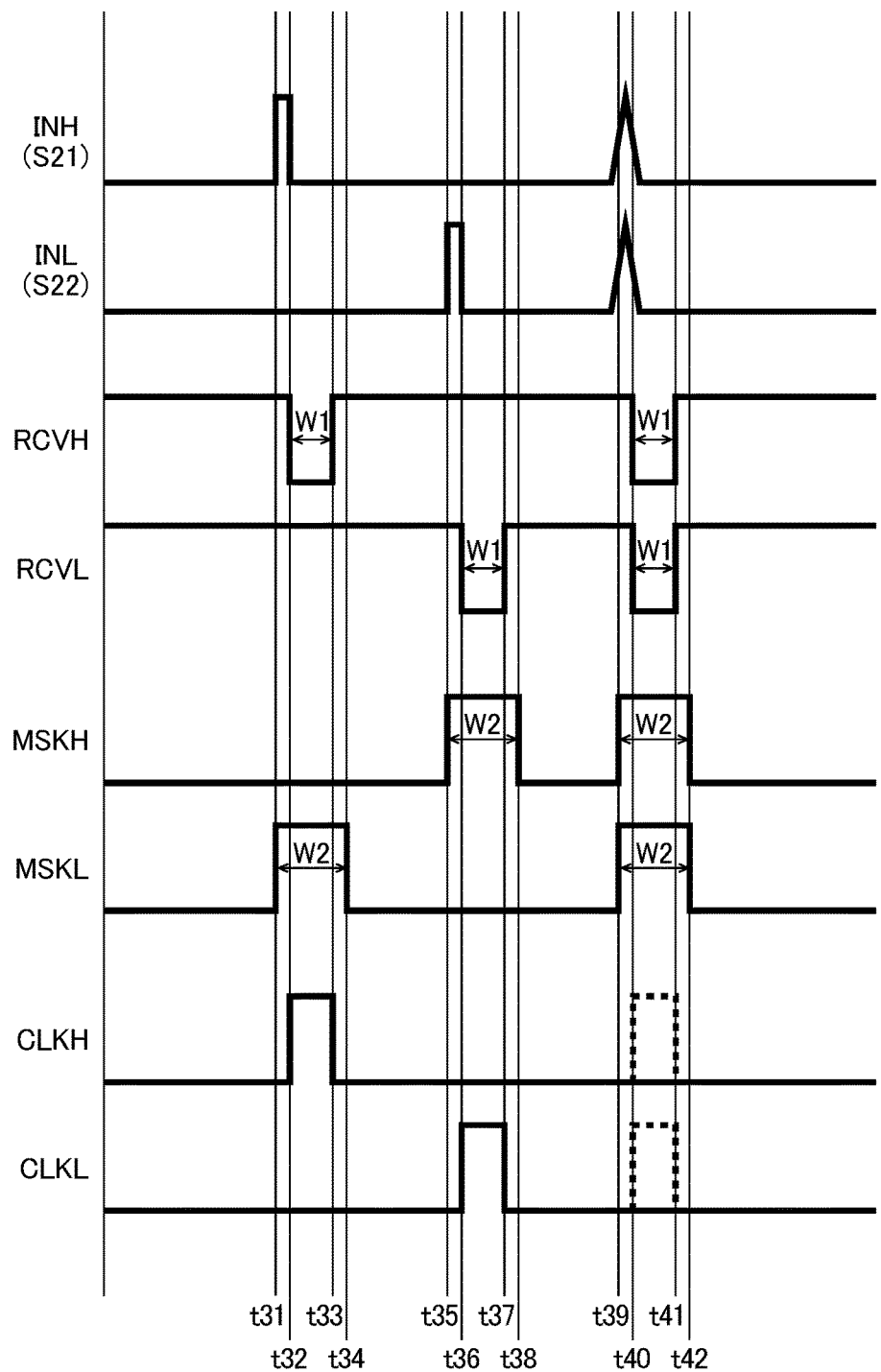
FIG. 8 is a timing chart showing basic operation of a noise cancel circuit.

FIG. 8 is a timing chart showing the basic operation of the noise cancel circuit 150, depicting, from top down, the input signals INH and INL (that is, the reception pulse signals S21 and S22), the reception signals RCVH and RCVL, the mask signals MSKH and MSKL, and the clock signals CLKH and CLKL (that is, the reception pulse signals having undergone noise cancellation).

At time point t31, when a regular pulse (that is, a legitimate pulse fed from the isolating element 121) rises in the input signal INH, a reception signal RCVH with a pulse width W1 (the time interval from t32 to t33) and a mask signal MSKL with a pulse width W2 (the time interval from t31 to t34) are generated. On the other hand, at time point t31, no pulse rises in the input signal INL, and thus the reception signal RCVL and the mask signal MSKH continue to be kept at their logic levels in the steady state.

As mentioned previously, when the mask signal MSKH is at low level, the logically inverted signal of the reception signal RCVH is output as the clock signal CLKH; when the mask signal MSKL is at high level, irrespective of the logic level of the reception signal RCVL, the clock signal CLKL is held at low level. Here, the clock signal CLKL should intrinsically be kept at low level, and thus no discrepancy arises.

At time point t35, when a regular pulse (that is, a legitimate pulse fed from the isolating element 122) rises in the input signal INL, a reception signal RCVL with a pulse width W1 (the time interval from t36 to t37) and a mask signal MSKH with a pulse width W2 (the time interval from t35 to t38) are generated. On the other hand, at time point t35, no pulse rises in the input signal INH, and thus the reception signal RCVH and the mask signal MSKL continue to be kept at their logic levels in the steady state.

As mentioned previously, when the mask signal MSKL is at low level, the logically inverted signal of the reception signal RCVL is output as the clock signal CLKL; when the mask signal MSKH is at high level, irrespective of the logic level of the reception signal RCVH, the clock signal CLKL is held at low level. Here, the clock signal CLKH should intrinsically be kept at low level, and thus no discrepancy arises.

Now consider a case where in-phase noise occurs in both the input signals INH and INL. For example, when, at time point t39, noise pulses arise in both the input signals INH and INL, reception signals RCVH and RCVL each with a pulse width W1 (the time interval from t40 to t41) and mask signals MSKH and MSKL each with a pulse width W2 (the time interval from t39 to t42) are generated.

Here, when the mask signal MSKH is at high level, irrespective of the logic level of the reception signal RCVH, the clock signal CLKH is held at low level. Likewise, when the mask signal MSKL is at high level, irrespective of the logic level of the reception signal RCVL, the clock signal CLKL is held at low level. This makes it possible to properly cancel the in-phase noise that occurs in both the input signals INH and INL.

For reliable cancellation of in-phase noise, it is preferable that the pulse width W2 of the mask signals MSKH and MSKL be larger than the pulse width W1 of the reception signals RCVH and RCVL ascribable to the occurrence of noise, and in addition that the pulse width W2 completely overlap the pulse width W1.

That is, it is preferable that, as shown in FIG. 8, the reception signals RCVH and RCVL and the mask signals MSKH and MSKL be generated such that, after the mask signals MSKH and MSKL rise to high level (the logic level during masking), the reception signals RCVH and RCVL fall to low level (the logic level during pulse generation), and in addition that, after the reception signals RCVH and RCVL rise to high level (the logic level during steady operation), the mask signals MSKH and MSKL fall to low level (the logic level during no masking).

The pulse generation circuit 110, which is provided on the transmission side, is subject to a restriction that requires that, after it pulse-drives one of the transmission pulse signals S11 and S12, at least until the masking period of the mask cancel circuit 150 (that is, the pulse width W2 of the mask signals MSKH and MSKL) elapses, it suspend the pulse-driving of the other of the transmission pulse signals S11 and S12.

With reference back to FIG. 7, the blocks constituting the signal transfer device 100 will be described further. The pulse reception circuit 130 includes the RS flip-flop 131 and the counters 132 and 133. The pulse reception circuit 130 counts the numbers of pulses in the clock signals CLKH and CLKL respectively to switch the logic level of the reception pulse signal S30 (and hence the output signal So).

The RS flip-flop 131 determines the logic level of the reception pulse signal S30 based on both a set signal S fed from the counter 132 and a reset signal R fed from the counter 133. Specifically, when the set signal S rises to high level, the RS flip-flop 131 sets the reception pulse signal S30 to high level and, when the reset signal R rises to high level, the RS flip-flop 131 resets the reception pulse signal S30 to low level.

The counter 132 includes D flip-flops DFF1 and DFF2 and an inverter INV1. The counter 132 counts the number of pulses in the clock signal CLKH to generate the set signal S.

The clock terminals of the D flip-flops DFF1 and DFF2 are both connected to a terminal to which the clock signal CLKH is applied. The data terminal (D) of the D flip-flop DFF1 is connected to a terminal to which a high-level signal is applied (that is, a power terminal). The output terminal (Q) of the D flip-flop DFF1 is connected to the data terminal (D) of the D flip-flop DFF2. The output terminal (Q) of the D flip-flop DFF2 is, as a terminal from which the set signal S is output, connected to the set terminal (S) of the RS flip-flop 131.

The reset terminals of the D flip-flops DFF1 and DFF2 are both connected to a terminal to which a reset signal RSTH is applied. The reset signal RSTH is the logically inverted signal of the mask signal MSKH, and is generated by the inverter INV1.

Configured as described above, the counter 132 raises the set signal S to high level when the number of pulses in the clock signal CLKH reaches a predetermined value (for example, 2). This predetermined value can be set freely by changing the number of stages of D flip-flops.

When the reset signal RSTH falls to low level, the counter 132 is reset, so that its count value CNTH is set back to its initial value (=0). As mentioned previously, the reset signal RSTH is the logically inverted signal of the mask signal MSKH, and not only when a legitimate pulse is generated in the input signal INL, but also when in-phase noise occurs in it, the reset signal RSTH falls to low level. Accordingly, the counter 132 is reset not only during the low-level period of the input signal Si but also when in-phase noise occurs.

The counter 133 includes D flip-flops DFF3 and DFF4 and an inverter INV2. The counter 133 counts the number of pulses in the clock signal CLKL to generate the reset signal R.

The clock terminals of the D flip-flops DFF3 and DFF4 are both connected to a terminal to which the clock signal CLKL is applied. The data terminal (D) of the D flip-flop DFF3 is connected to a terminal to which a high-level signal is applied (that is, a power terminal). The output terminal (Q) of the D flip-flop DFF3 is connected to the data terminal (D) of the D flip-flop DFF4. The output terminal (Q) of the D flip-flop DFF4 is, as a terminal from which the reset signal R is output, connected to the reset terminal (R) of the RS flip-flop 131.

The reset terminals of the D flip-flops DFF3 and DFF4 are both connected to a terminal to which a reset signal RSTL is applied. The reset signal RSTL is the logically inverted signal of the mask signal MSKL, and is generated by the inverter INV2.

Configured as described above, the counter 133 raises the reset signal R to high level when the number of pulses in the clock signal CLKL reaches a predetermined value (for example, 2). This predetermined value can be set freely by changing the number of stages of D flip-flops.

When the reset signal RSTL falls to low level, the counter 133 is reset, so that its count value CNTL is set back to its initial value (=0). As mentioned previously, the reset signal RSTL is the logically inverted signal of the mask signal MSKL, and not only when a legitimate pulse is generated in the input signal INH, but also when in-phase noise occurs in it, the reset signal RSTL falls to low level. Accordingly, the counter 133 is reset not only during the high-level period of the input signal Si but also when in-phase noise occurs.

Figure 9:
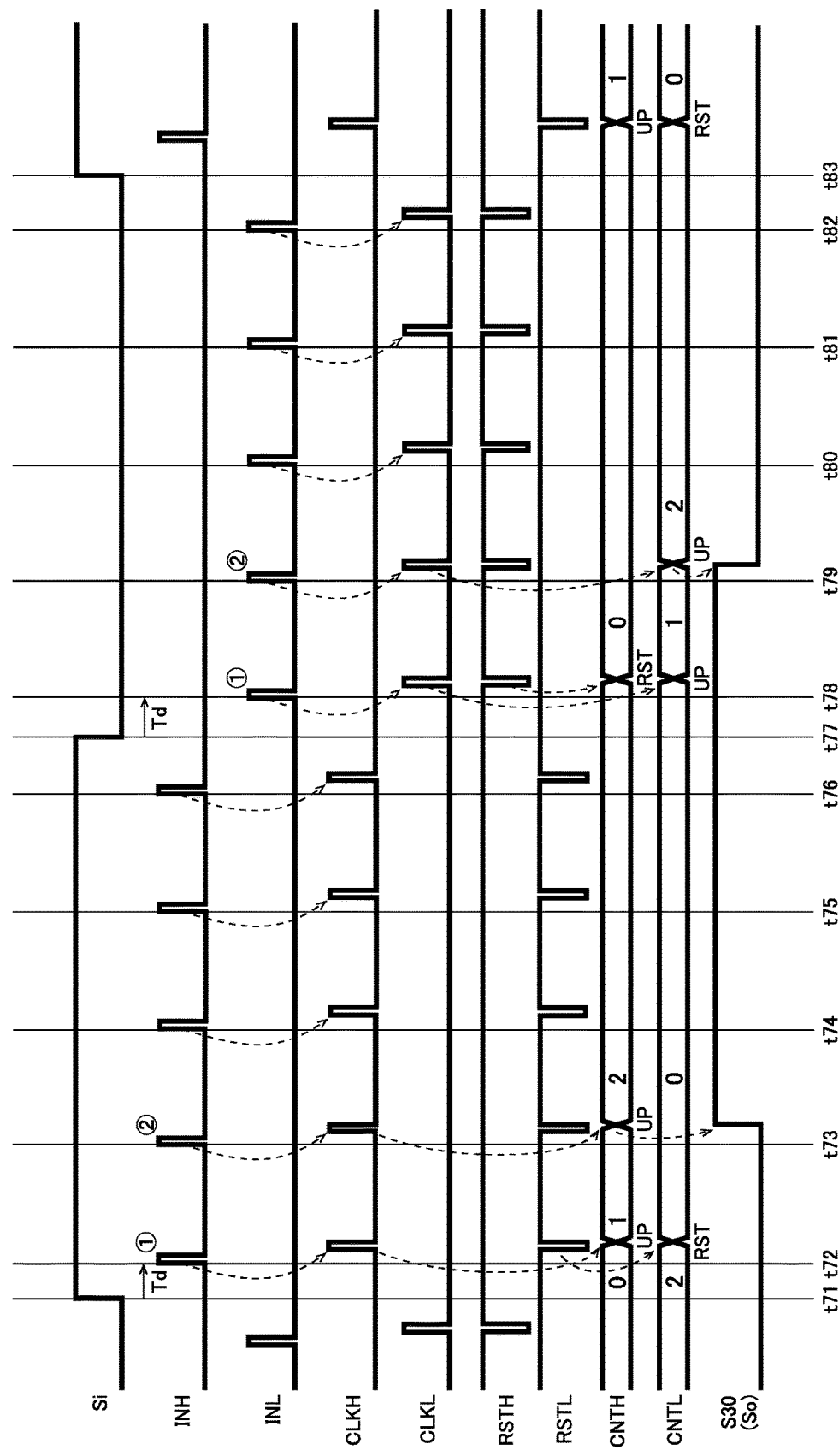
FIG. 9 is a timing chart showing pulse reception operation (without noise) in the second embodiment.

FIG. 9 is a timing chart showing the pulse reception operation (without noise) in the signal transfer device 100 (in particular, the pulse reception circuit 130) of the second embodiment, depicting, from top down, the input signal Si, the input signals INH and INL, the clock signals CLKH and CLKL, the reset signals RSTH and RSTL, the count values CNTH and CNTL, and the reception pulse signal S30 (and hence the output signal So).

At time point t71, when the input signal Si rises to high level, then, after the lapse of a transmission delay time Td, the input signal INH starts to be pulse-driven (see the time interval from t72 to t76).

Here, every time the input signal INH rises to high level, also the clock signal CLKH rises to high level. Accordingly, the count value CNTH keeps being incremented by one at a time from the initial value (=0). When CNTH=2, the reception pulse signal S30 is set to high level.

Moreover, every time the clock signal CLKH rises to high level, the reset signal RSTL falls to low level. Accordingly, the count value CNTL is set back to the initial value (=0).

At time point t77, when the input signal Si falls to low level, then, after the lapse of the transmission delay time Td, the input signal INL starts to be pulse-driven (see the time interval from t78 to t82).

Here, every time the input signal INL rises to high level, also the clock signal CLKL rises to high level. Accordingly, the count value CNTL keeps being incremented by one at a time from the initial value (=0). When CNTL=2, the reception pulse signal S30 is reset to low level.

Moreover, every time the clock signal CLKL rises to high level, the reset signal RSTH falls to low level. Accordingly, the count value CNTH is set back to the initial value (=0).

After time point t83, pulse reception operation like that described above is repeated.

As described above, in a case where no in-phase noise occurs in either of the input signals INH and INL, when the second pulse is generated in each of the input signals INH and INL, the logic level of the reception pulse signal S30 is switched.

Figure 10:
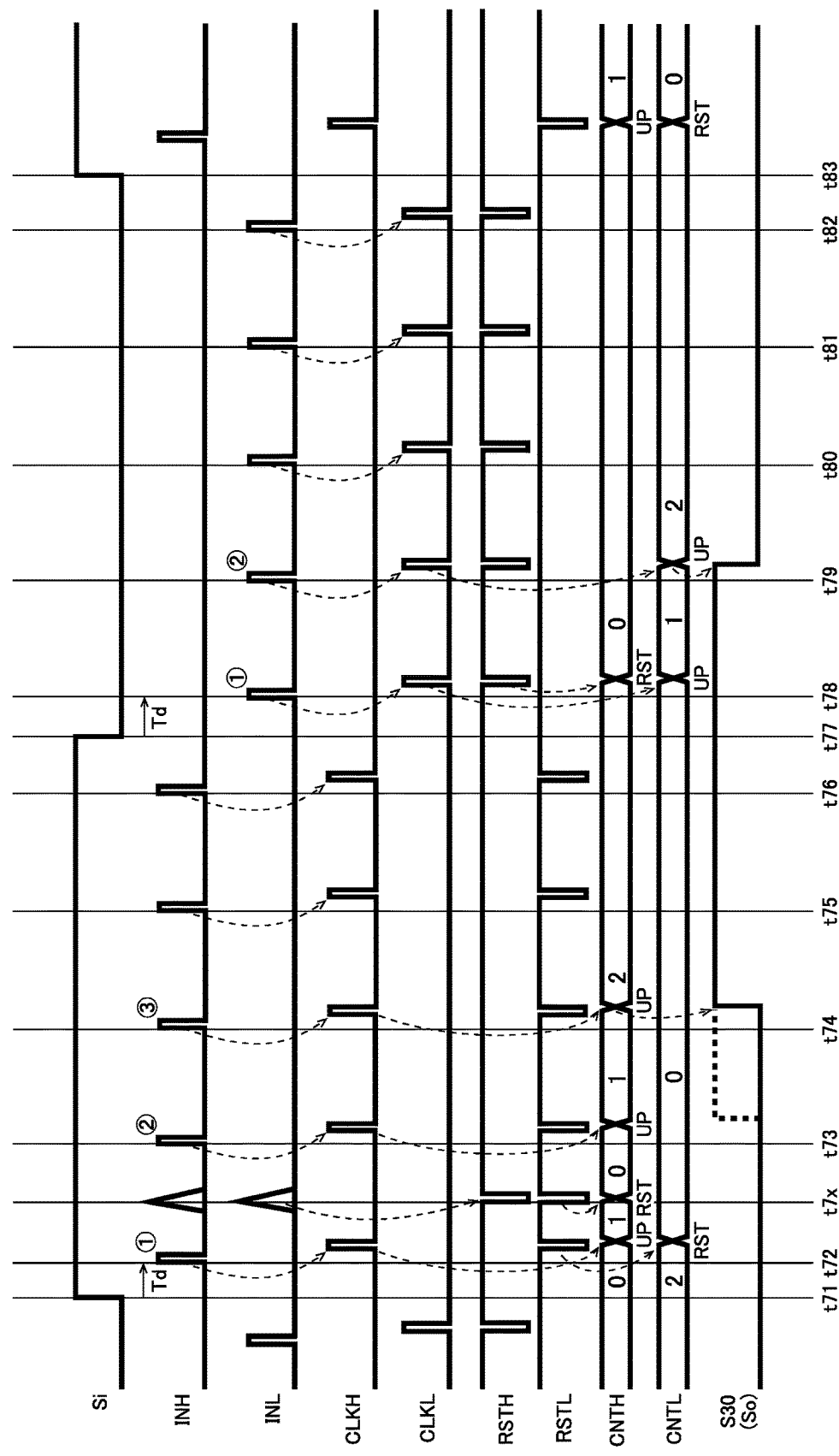
FIG. 10 is a timing chart showing pulse reception operation (with noise) in the second embodiment.

FIG. 10 is a timing chart showing the pulse reception operation (with noise) in the signal transfer device 100 (in particular, the pulse reception circuit 130) of the second embodiment, depicting, like FIG. 9 referred to previously, from top down, the input signal Si, the input signals INH and INL, the clock signals CLKH and CLKL, the reset signals RSTH and RSTL, the count values CNTH and CNTL, and the reception pulse signal S30 (and hence the output signal So).

In FIG. 10, at time point t7x (which occurs, after the time point t71 that the input signal Si rises to high level, between the time point t72 that a first pulse is generated in the input signal INH and the time point t73 that a second pulse is generated in the input signal INH), in-phase noise occurs in both the input signals INH and INL.

At that time, with respect to the clock signals CLKH and CLKL, owing to the action (see FIG. 8) of the noise cancel circuit 150 described previously, noise-induced unnecessary pulses are masked. Accordingly, no unintended increment of the count values CNTH and CNTL occurs.

On the other hand, the reset signals RSTH and RSTL are the logically inverted signals of the mask signals MSKH and MSKL, and thus when in-phase noise occurs in both the input signals INH and INL, noise-induced pulses occur in the reset signals RSTH and RSTL. Accordingly, the count values CNTH and CNTL are both set back to the initial value (=0).

The count value CNTL has been set back to the initial value (=0) since before time point t7x, and thus is not particularly affected. As for the count value CNTH, however, it starts to be incremented all over again. Thus, the reception pulse signal S30 does not rise to high level until, after the noise-induced resetting of the count, a second pulse is generated in the input signal INH, that is, until a third pulse as counted from the beginning is generated.

As described above, in the signal transfer device 100 of the second embodiment, the occurrence of in-phase noise prolongs the signal delay time (that is, the time required after the logic level of the input signal Si is switched until the logic level of the output signal So is switched). An improvement in this respect has been made in a third embodiment, which will now be proposed.

Signal Transfer Device (Third Embodiment)

Figure 11:
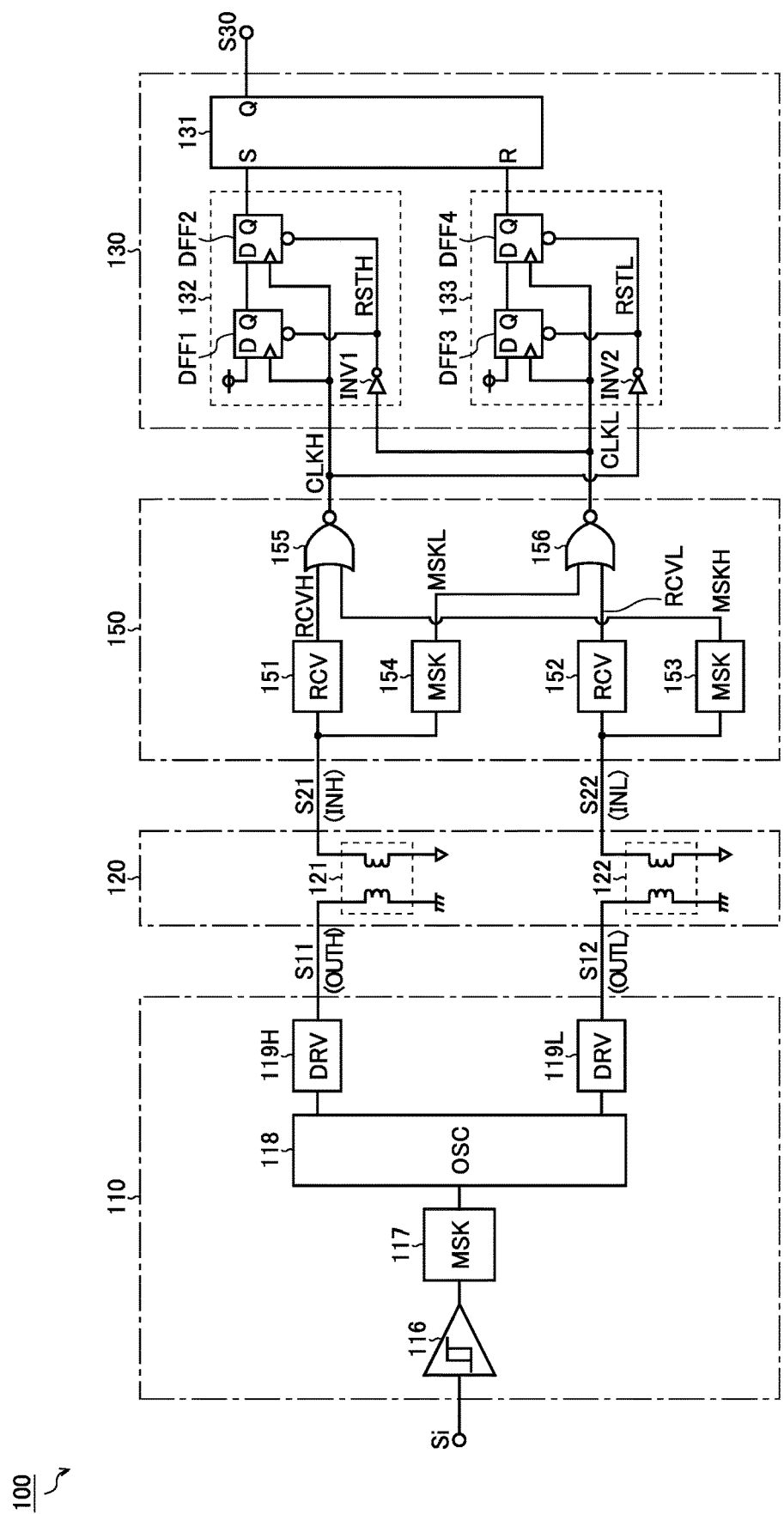
FIG. 11 is a diagram showing a third embodiment of a signal transfer device.

FIG. 11 is a diagram showing a third embodiment of the signal transfer device 100. The signal transfer device 100 of this embodiment, while being based on the second embodiment (FIG. 7) described previously, uses, as the reset signal RSTH, not the logically inverted signal of the mask signal MSKH, but the logically inverted signal of the clock signal CLKL, and uses, as the reset signal RSTL, not the logically inverted signal of the mask signal MSKL, but the logically inverted signal of the clock signal CLKH.

Specifically, when a pulse is generated in the clock signal CLKL, the count value CNTH of the counter 132 is set back to the initial value (=0); when a pulse is generated in the clock signal CLKH, the count value CNTL of the counter 133 is set back to the initial value (=0).

As mentioned previously, even when in-phase noise occurs in both the input signals INH and INL, owing to the action of the noise cancel circuit 150, no noise-induced pulses occur in the clock signals CLKH and CLKL.

Thus, the counter 132 is reset during the low-level period of the input signal Si (that is, the period in which legitimate pulses are generated in the clock signal CLKL), but is not reset even when in-phase noise occurs. Likewise, the counter 133 is reset during the high-level period of the input signal Si (that is, the period in which legitimate pulses are generated in the clock signal CLKH), but is not reset even when in-phase noise occurs.

Figure 12:
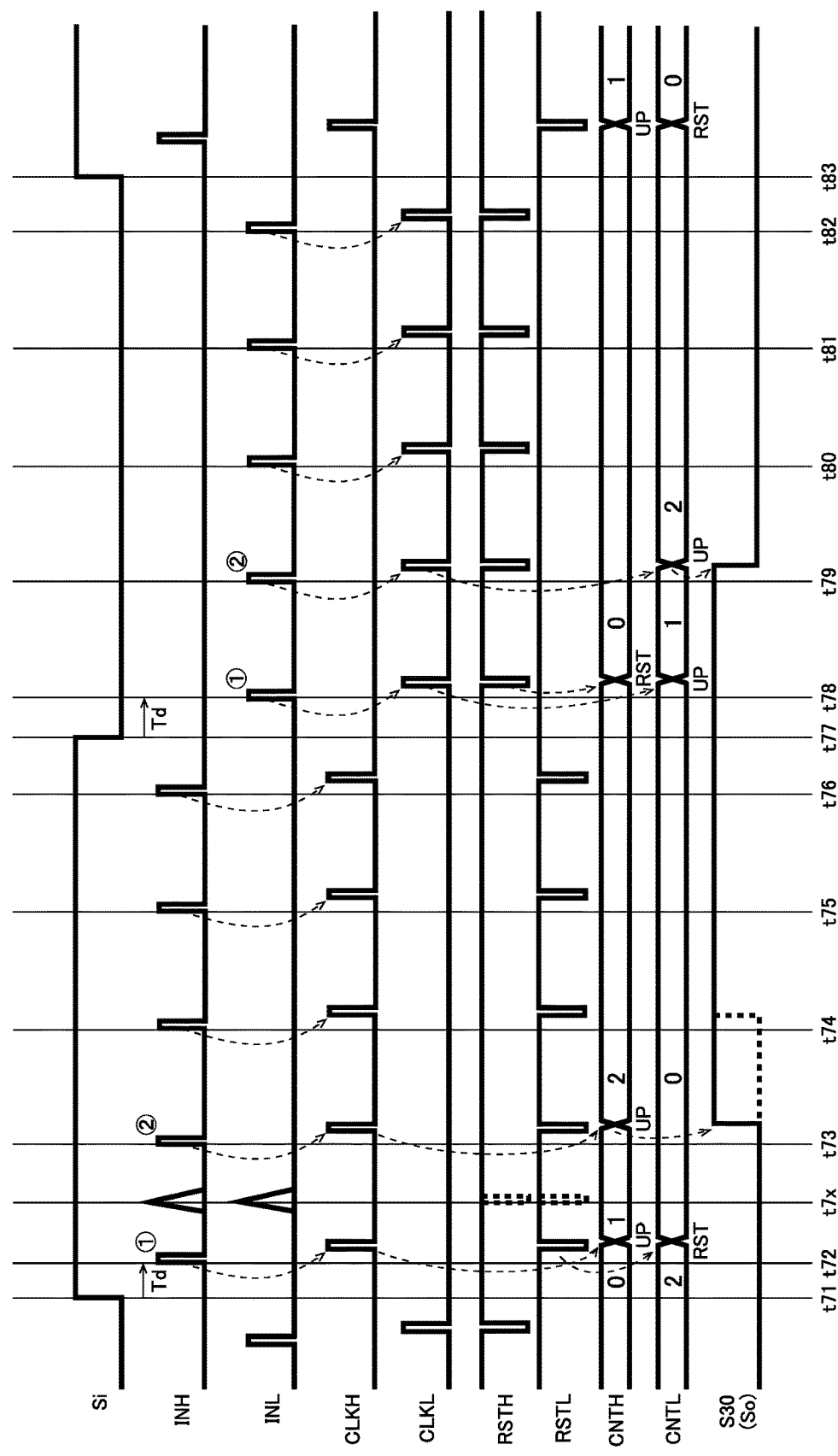
FIG. 12 is a timing chart showing pulse reception operation (with noise) in the third embodiment.

FIG. 12 is a timing chart showing the pulse reception operation (with noise) in the signal transfer device 100 (in particular, the pulse reception circuit 130) of the third embodiment, depicting, like FIGS. 9 and 10 referred to previously, from top down, the input signal Si, the input signals INH and INL, the clock signals CLKH and CLKL, the reset signals RSTH and RSTL, the count values CNTH and CNTL, and the reception pulse signal S30 (and hence the output signal So).

The pulse reception operation in the absence of in-phase noise is the same as that shown in FIG. 9 referred to previously, and therefore no overlapping description will be repeated. With reference to FIG. 12, the following description focuses on the pulse reception operation in the presence of in-phase noise.

In FIG. 12, as in FIG. 10 referred to previously, at time point t7x (which occurs, after the time point t71 that the input signal Si rises to high level, between the time point t72 that a first pulse is generated in the input signal INH and the time point t73 that a second pulse is generated in the input signal INH), in-phase noise occurs in both the input signals INH and INL.

At that time, with respect to the clock signals CLKH and CLKL, owing to the action (see FIG. 8) of the noise cancel circuit 150 described previously, noise-induced unnecessary pulses are masked. Accordingly, no unintended increment of the count values CNTH and CNTL occurs.

Given that no noise-induced pulse occurs in the clock signals CLKH and CLKL, no noise-induced pulse occurs in their respective logically inverted signals, that is, the reset signals RSTH and RSTL, either. Accordingly, the count values CNTH and CNTL are not set back to the initial value (=0) by in-phase noise, and the count value CNTH continues to be incremented. As a result, the reception pulse signal S30 rises to high level when a second pulse is generated in the input signal INH as when no noise occurs (FIG. 9).

As described above, with the signal transfer device 100 of the third embodiment, even when in-phase noise occurs in input signals INH and INL in a multiple transmission-reception system, it does not unnecessarily prolong the signal delay time (the time required after the logic level of the input signal Si is switched until the logic level of the output signal So is switched).

Noise Cancel Circuit

Figure 13:
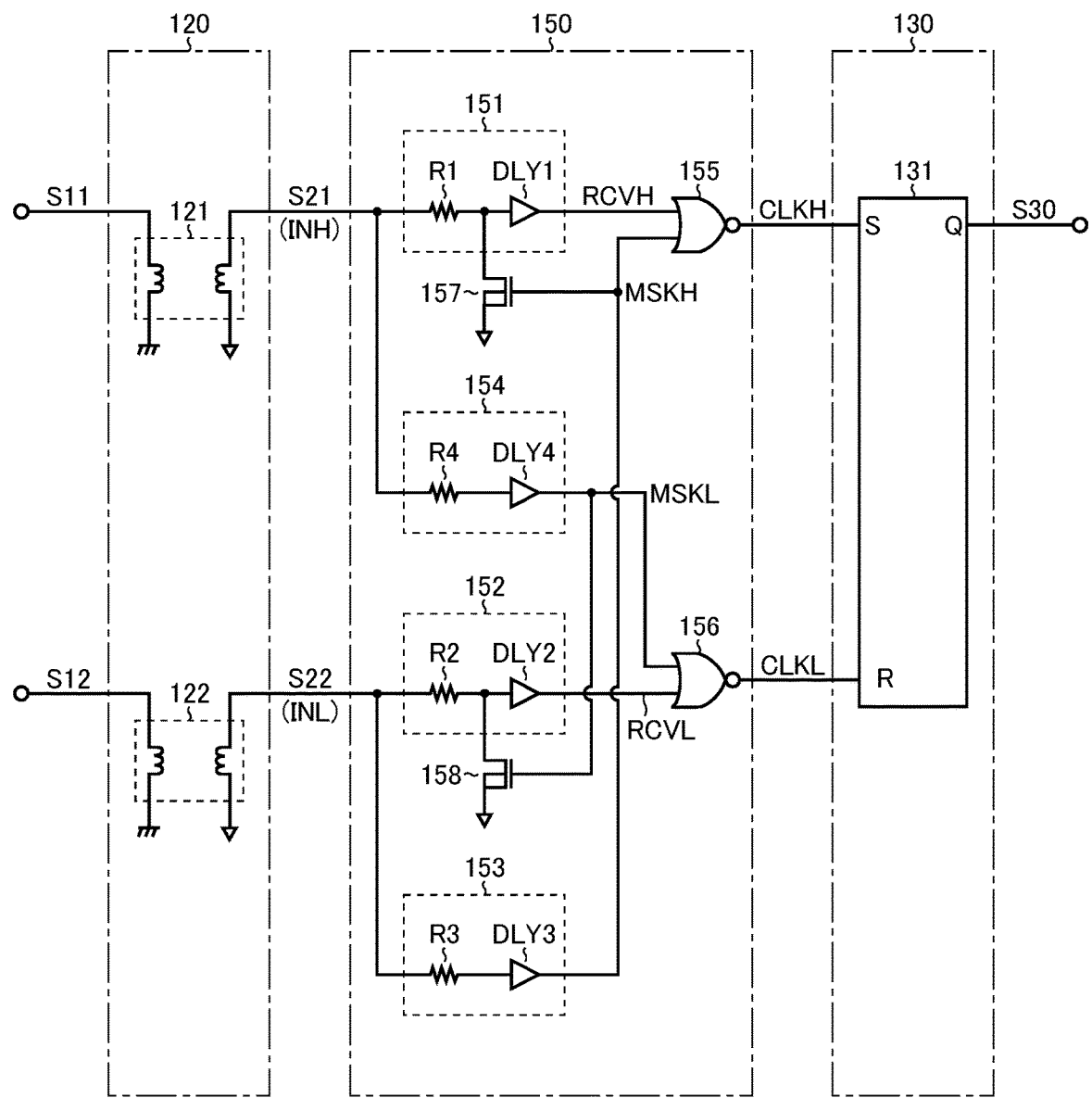
FIG. 13 is a diagram showing one configuration example of a noise cancel circuit.

FIG. 13 is a diagram showing one configuration example of the noise cancel circuit provided between the isolation circuit 120 and the pulse reception circuit 130.

The noise cancel circuit 150 of this configuration example receives, as the input signals INH and INL respectively, the reception pulse signals S21 and S22 fed to it in parallel from the isolating elements 121 and 122, and cancels instantaneous transient in-phase noise (what is generally called CMTI noise; hereinafter referred to simply as in-phase noise) that occurs in each of those signals, thereby to generate clock signals CLKH and CLKL, which the noise cancel circuit 150 then feeds, as reception pulse signals having undergone pulse cancellation, to the pulse reception circuit 130 (for example, the RS flip-flop 131).

The noise cancel circuit 150 includes, as components constituting it, reception signal generator blocks 151 and 152, mask signal generator blocks 153 and 154, NOR gates 155 and 156, and discharge transistors 157 and 158 (in FIG. 13, both are NMOSFETs).

The reception signal generator block 151 is a circuit block that generates a reception signal RCVH according to the input signal INH, and includes a resistor R1 and a delay stage DLY1.

The first terminal of the resistor R1 is connected to a terminal to which the input signal INH is applied (that is, the secondary output terminal of the isolating element 121). The second terminal of the resistor R1 is connected to the input terminal of the delay stage DLY1.

For example, when the input signal INH rises to high level, then, at the time point that a predetermined delay time T11 has elapsed after the rise of the input signal INH, the delay stage DLY1 drops the reception signal RCVH from high level (the logic level during steady operation) to low level (the logic level during pulse generation), and then, at the time point that a predetermined delay time T12 (>T11) has elapsed after the rise of the input signal INH, the delay stage DLY1 raises the reception signal RCVH from low level to high level.

That is, when the input signal INH rises to high level, the reception signal generator block 151 generates a reception signal RCVH with a predetermined pulse width W1 (=T12−T11).

The reception signal generator block 152 is a circuit block that generates a reception signal RCVL according to the input signal INL, and includes a resistor R2 and a delay stage DLY2.

The first terminal of the resistor R2 is connected to a terminal to which the input signal INL is applied (that is, the secondary output terminal of the isolating element 122). The second terminal of the resistor R2 is connected to the input terminal of the delay stage DLY2.

For example, when the input signal INL rises to high level, then, at the time point that a predetermined delay time T11 has elapsed after the rise of the input signal INL, the delay stage DLY2 drops the reception signal RCVL from high level (the logic level during steady operation) to low level (the logic level during pulse generation), and then, at the time point that a predetermined delay time T12 (>T11) has elapsed after the rise of the input signal INL, the delay stage DLY2 raises the reception signal RCVL from low level to high level.

That is, when the input signal INL rises to high level, the reception signal generator block 152 generates a reception signal RCVL with a predetermined pulse width W1 (=T12−T11).

Through wave-shaping in the reception signal generator blocks 151 and 152 described above, even if the input signals INH and INL have a very narrow pulse width, it is possible to reliably perform pulse reception in the pulse reception circuit 130 (that is, setting and resetting of the RS flip-flop 131).

The mask signal generator block 153 is a circuit block that generates the mask signal MSKH according to the input signal INL, and includes a resistor R3 and a delay stage DLY3.

The first terminal of the resistor R3 is connected to a terminal to which the input signal INL is applied (that is, the secondary output terminal of the isolating element 121). The second terminal of the resistor R3 is connected to the input terminal of the delay stage DLY3.

For example, when the input signal INL rises to high level, then, at the time point of the rise of the input signal INL, without delay, the delay stage DLY3 raises the mask signal MSKH from low level (the logic level during steady operation) to high level (the logic level during pulse generation), and then, at the time point that a predetermined delay time T12 and subsequently a predetermined delay time T13 have elapsed after the rise of the input signal INL, the delay stage DLY3 drops the mask signal MSKH from high level to low level.

That is, when the input signal INL rises to high level, the mask signal generator block 153 generates a mask signal MSKH with a predetermined pulse width W2 (=T12+T13) larger than the pulse width W1.

The mask signal generator block 154 is a circuit block that generates the mask signal MSKL according to the input signal INH, and includes a resistor R4 and a delay stage DLY4.

The first terminal of the resistor R4 is connected to a terminal to which the input signal INH is applied (that is, the secondary output terminal of the isolating element 122). The second terminal of the resistor R4 is connected to the input terminal of the delay stage DLY4.

For example, when the input signal INH rises to high level, then, at the time point of the rise of the input signal INH, without delay, the delay stage DLY4 raises the mask signal MSKL from low level (the logic level during steady operation) to high level (the logic level during pulse generation), and then, at the time point that a predetermined delay time T12 and subsequently a predetermined delay time T13 have elapsed after the rise of the input signal INH, the delay stage DLY4 drops the mask signal MSKL from high level to low level.

That is, when the input signal INH rises to high level, the mask signal generator block 154 generates a mask signal MSKL with a predetermined pulse width W2 (=T12+T13) larger than the pulse width W1.

The NOR gate 155 generates a clock signal CLKH by taking the NOR (negative OR) between the reception signal RCVH and the mask signal MSKH. Accordingly, when the mask signal MSKH is at low level, the logically inverted signal of the reception signal RCVH is output as the clock signal CLKH. By contrast, when the mask signal MSKH is at high level, irrespective of the logic level of the reception signal RCVH, the clock signal CLKH is held at low level. The clock signal CLKH thus generated is used as the set signal for the RS flip-flop 131.

The NOR gate 156 generates a clock signal CLKL by taking the NOR (negative OR) between the reception signal RCVL and the mask signal MSKL. Accordingly, when the mask signal MSKL is at low level, the logically inverted signal of the reception signal RCVL is output as the clock signal CLKL. By contrast, when the mask signal MSKL is at high level, irrespective of the logic level of the reception signal RCVL, the clock signal CLKL is held at low level. The clock signal CLKL thus generated is used as the reset signal for the RS flip-flop 131.

The drain of the discharge transistor 157 is connected to the input terminal of the delay stage DLY1. The source and the back gate of the discharge transistor 157 is connected to a grounded terminal. The gate of the discharge transistor 157 is fed with the mask signal MSKH. So connected, the discharge transistor 157 is off when the mask signal MSKH is at low level, and is on when the mask signal MSKH is at high level. Accordingly, when the mask signal MSKH is at high level, the input signal INH (in particular, the voltage applied to the input terminal of the delay stage DLY1) is discharged via the discharge transistor 157. That is, when the input signal INL is being received, the discharge transistor 157 invalidates the reception of the input signal INH.

The drain of the discharge transistor 158 is connected to the input terminal of the delay stage DLY2. The source and the back gate of the discharge transistor 158 is connected to a grounded terminal. The gate of the discharge transistor 158 is fed with the mask signal MSKL. So connected, the discharge transistor 158 is off when the mask signal MSKL is at low level, and is on when the mask signal MSKL is at high level. Accordingly, when the mask signal MSKL is at high level, the input signal INL (in particular, the voltage applied to the input terminal of the delay stage DLY2) is discharged via the discharge transistor 158. That is, when the input signal INH is being received, the discharge transistor 158 invalidates the reception of the input signal INL.

The basic operation of the noise cancel circuit 150 is as described with reference to FIG. 8 referred to previously, and therefore no overlapping description will be repeated. As mentioned previously, the pulse generation circuit 110 is subject to a restriction that requires that, after it pulse-drives one of the transmission pulse signals S11 and S12, at least until the masking period of the mask cancel circuit 150 (that is, the pulse width W2 of the mask signals MSKH and MSKL) elapses, it suspend the pulse-driving of the other of the transmission pulse signals S11 and S12.

That is, if the pulse width W2 of each of the mask signals MSKH and MSKL can be reduced, that makes it possible to achieve accordingly fast noise cancellation, and hence to reduce the signal delay in the signal transfer device 100. This is in fact achieved through the introduction of the discharge transistors 157 and 158, of which the technical significance will now be discussed in detail through a comparison between the behavior without and with them.

Figure 14:
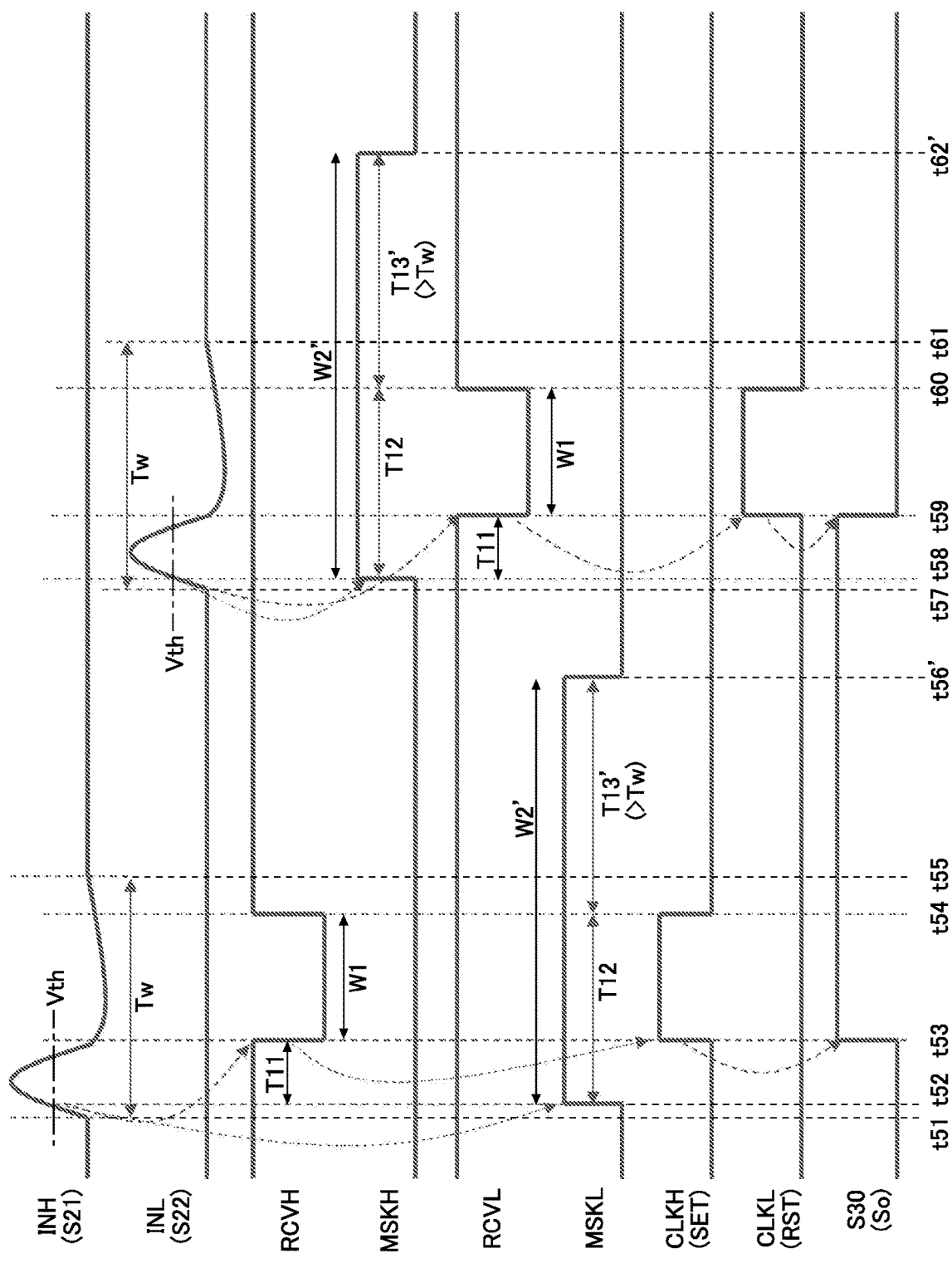
FIG. 14 is a timing chart showing an example of how a mask period is set (without discharge transistors)

FIG. 14 is a timing chart showing an example of how the masking period (=the pulse width W2) is set in a case where the discharge transistors 157 and 158 are not introduced, depicting, from top down, the input signals INH and INL (that is, the reception pulse signals S21 and S22), the reception signal RCVH, the mask signal MSKH, the reception signal RCVL, the mask signal MSKL, the clock signals CLKH and CLKL, and the reception pulse signal S30 (and hence the output signal So).

As shown in FIG. 14, during the pulse-driving of the input signal INH, the reception signal RCVH falls from high level to low level at the time point that, after the input signal INH exceeds a reception threshold value Vth, the delay time T11 has elapsed, and rises from low level to high level at the time point that, after the input signal INH exceeds the reception threshold value Vth, the delay time T12 (>T11) has elapsed (see the time interval from t52 to t54). As a result, the pulse width W1 of the reception signal RCVH is set equal to the difference (=T12−T11) between the delay times T11 and T12.

On the other hand, the mask signal MSKL rises from low level to high level without delay at the time point that the input signal INH exceeds the reception threshold value Vth, and falls from the high level to low level at the time point that, after the input signal INH exceeds the reception threshold value Vth, the delay time T12 and subsequently the delay time T13' have elapsed (see the time interval from t52 to t56'). As a result, the pulse width W2' of the mask signal MSKL is set equal to the sum (T12+T13') of the delay times T12 and T13'.

Likewise, during the pulse-driving of the input signal INL, the reception signal RCVL falls from high level to low level at the time point that, after the input signal INL exceeds the reception threshold value Vth, the delay time T11 has elapsed, and rises from low level to high level at the time point that, after the input signal INL exceeds the reception threshold value Vth, the delay time T12 (>T11) has elapsed (see the time interval from t58 to t60). As a result, the pulse width W1 of the reception signal RCVL is set equal to the difference (=T12−T11) between the delay times T11 and T12.

On the other hand, the mask signal MSKH rises from low level to high level without delay at the time point that the input signal INL exceeds the reception threshold value Vth, and falls from the high level to low level at the time point that, after the input signal INL exceeds the reception threshold value Vth, the delay time T12 and subsequently the delay time T13' have elapsed (see the time interval from t58 to t62'). As a result, the pulse width W2' of the mask signal MSKH is set equal to the sum (T12+T13') of the delay times T12 and T13'.

Without the discharge transistors 157 and 158, the delay time T13' has to be longer than the pulse duration Tw of the input signals INH and INL. The pulse duration Tw here refers to the period after a high-level regular pulse rises in the input signal INH or INL until it converges to low level (the logic level during steady operation) (see the time intervals from t51 to t55 and from t57 to t71).

The reason that, without the discharge transistors 157 and 158, it is necessary that T13'>Tw will now be explained in detail with reference to FIG. 15.

Figure 15:
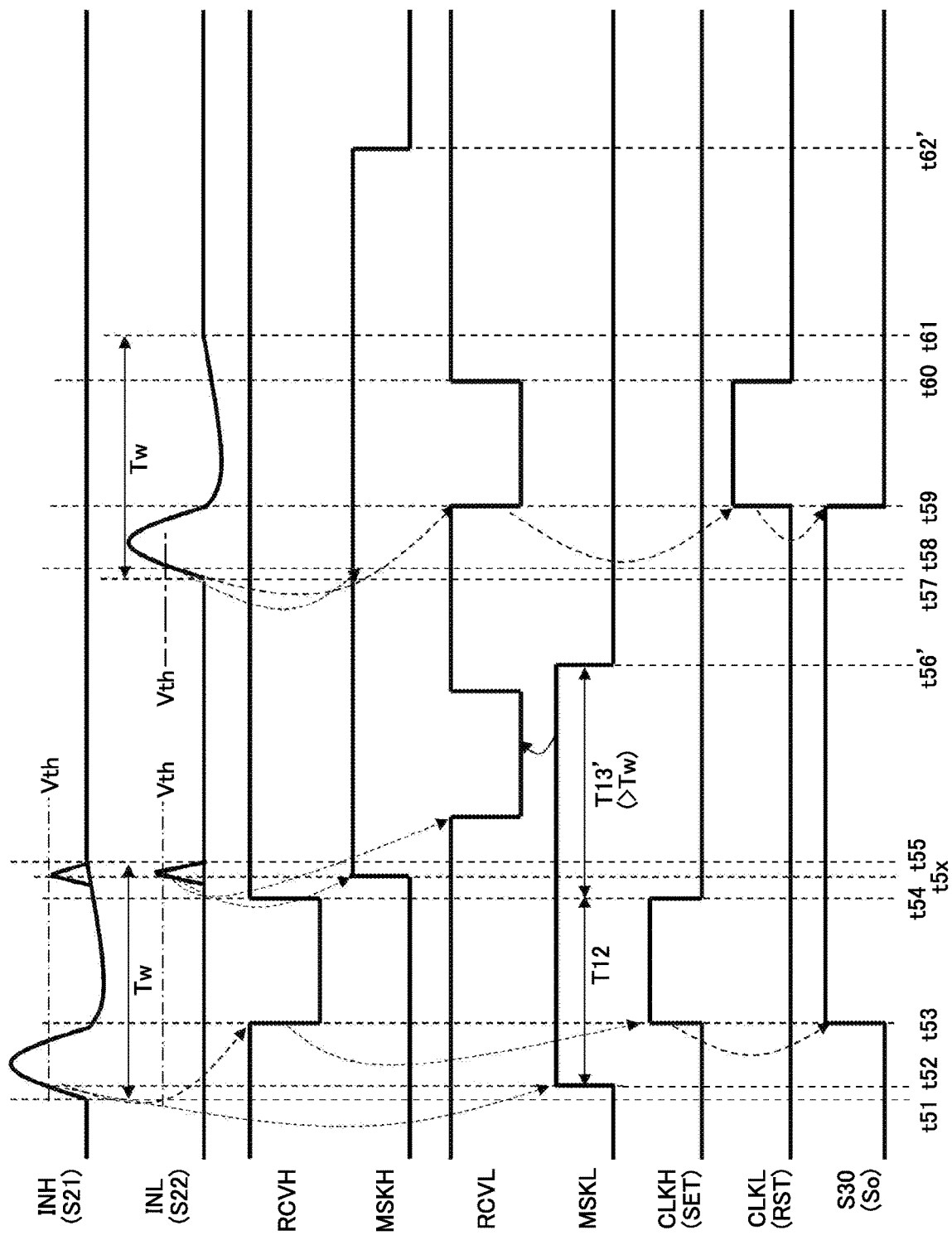
FIG. 15 is a timing chart showing an example of operation when noise occurs (without discharge transistors)

FIG. 15 is a timing chart showing an example of operation when in-phase noise occurs in a case where the discharge transistors 157 and 158 are not introduced, depicting, like FIG. 14, from top down, the input signals INH and INL (that is, the reception pulse signals S21 and S22), the reception signal RCVH, the mask signal MSKH, the reception signal RCVL, the mask signal MSKL, the clock signals CLKH and CLKL, and the reception pulse signal S30 (and hence the output signal So).

As shown in FIG. 8 referred to previously, when in-phase noise occurs in both the input signals INH and INL simultaneously, owing to the action of the noise cancel circuit 150, the in-phase noise occurring in those signal can be canceled properly.

However, while the input signals INH and INL are being pulse-driven (that is, while regular pulses are being received), there are periods (see the time intervals from t53 to t56 and from t59 to t62) in which the input signals INH and INL swing to a negative potential (a potential lower than the low level in steady operation). If in-phase noise occurs during one of those periods, only one of the input signals INH and INL may exceed the reception threshold value Vth.

In FIG. 15, during a period in which the input signal INH swings to a negative potential (at time point t5x), in-phase noise occurs, with the result that only the input signal INL exceeds the reception threshold value Vth, generating a noise-induced pulse only in the reception signal RCVL. On the other hand, the input signal INH does not exceed the reception threshold value Vth, and thus no trigger that tends to raise the mask signal MSKL to high level again does not occur.

Accordingly, to cancel a noise-induced pulse occurring in the reception signal RCVL, it is necessary to keep the mask signal MSKL, which is already at high level in response to a regular pulse in the input signal INH, at high level continuously, even after the lapse of the delay time T12, for the delay time T13'.

In particular, with a setting such that T13'>Tw, even in the worst case as when in-phase noise occurs immediately before the expiration of the pulse duration Tw, it is possible to properly cancel a noise-induced pulse that occurs in the reception signal RCVL. Thus, no unnecessary pulse occurs in the clock signal CLKL, nor is the driving of the reception pulse signal S30 (and hence the output signal So) affected adversely.

However, without the discharge transistors 157 and 158, the mask signals MSKH and MSKL have a large pulse width W2' (=T12+T13'). This leaves room for improvement in terms of faster noise cancellation.

Figure 16:
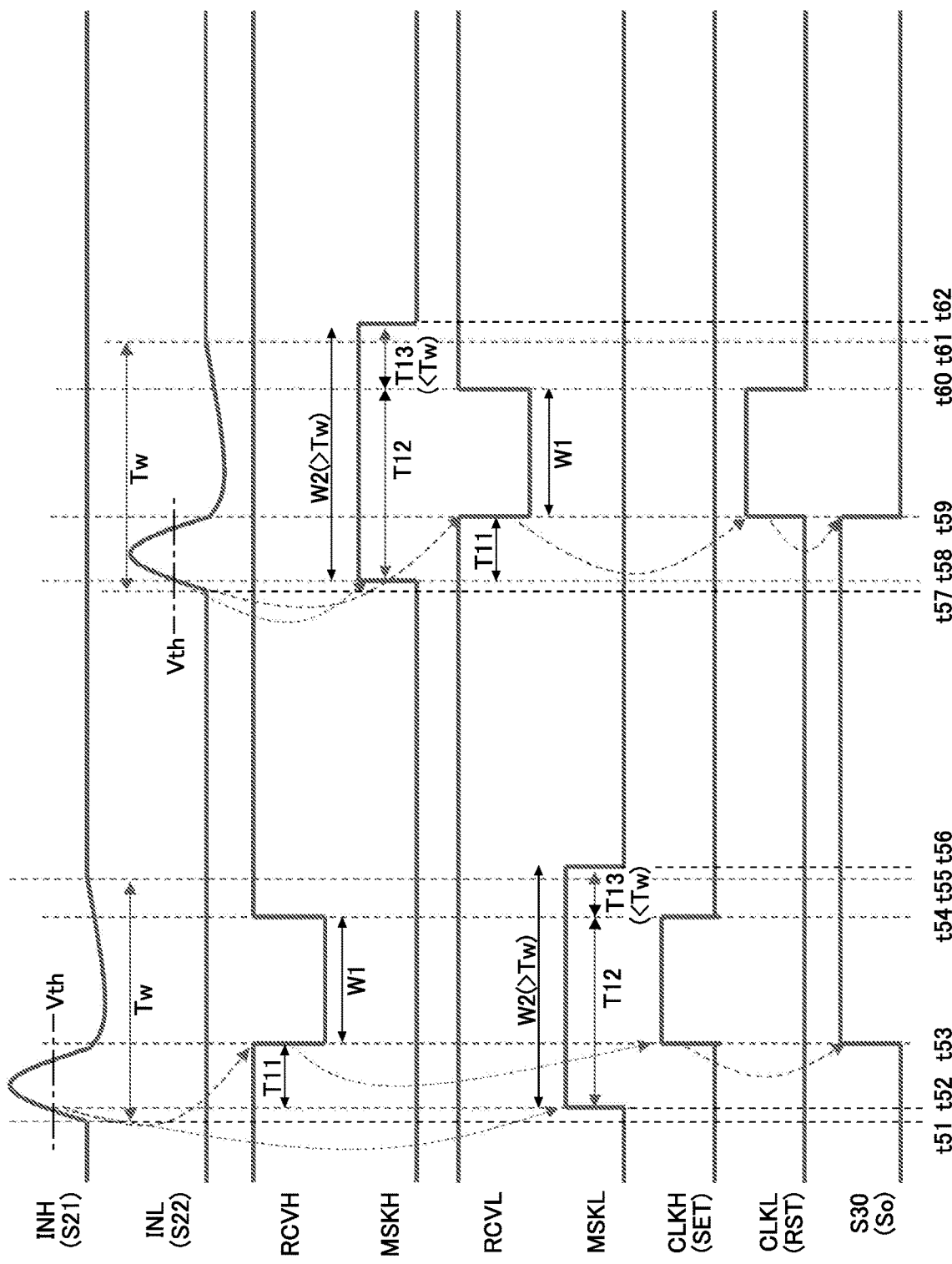
FIG. 16 is a timing chart showing an example of how a mask period is set (with discharge transistors)

FIG. 16 is a timing chart showing an example of how the masking period (=the pulse width W2) is set in a case where the discharge transistors 157 and 158 are introduced, depicting, like FIGS. 14 and 15, from top down, the input signals INH and INL (that is, the reception pulse signals S21 and S22), the reception signal RCVH, the mask signal MSKH, the reception signal RCVL, the mask signal MSKL, the clock signals CLKH and CLKL, and the reception pulse signal S30 (and hence the output signal So).

As shown in FIG. 16, with the discharge transistors 157 and 158 introduced, the pulse width W2 (=T12+T13) of the mask signals MSKH and MSKL has only to be longer than the pulse duration Tw of the input signals INH and INL. As for the delay time T13, it can be set shorter than the pulse duration Tw of the input signals INH and INL.

That is, with the discharge transistors 157 and 158, it is possible to make the pulse width W2 of the mask signals MSKH and MSKL shorter than the pulse width W2' as it is without the discharge transistors 157 and 158 (Tw<W2<W2').

The reason that, with the discharge transistors 157 and 158, a setting such that T13>Tw is possible will now be explained in detail with reference to FIG. 17.

Figure 17:
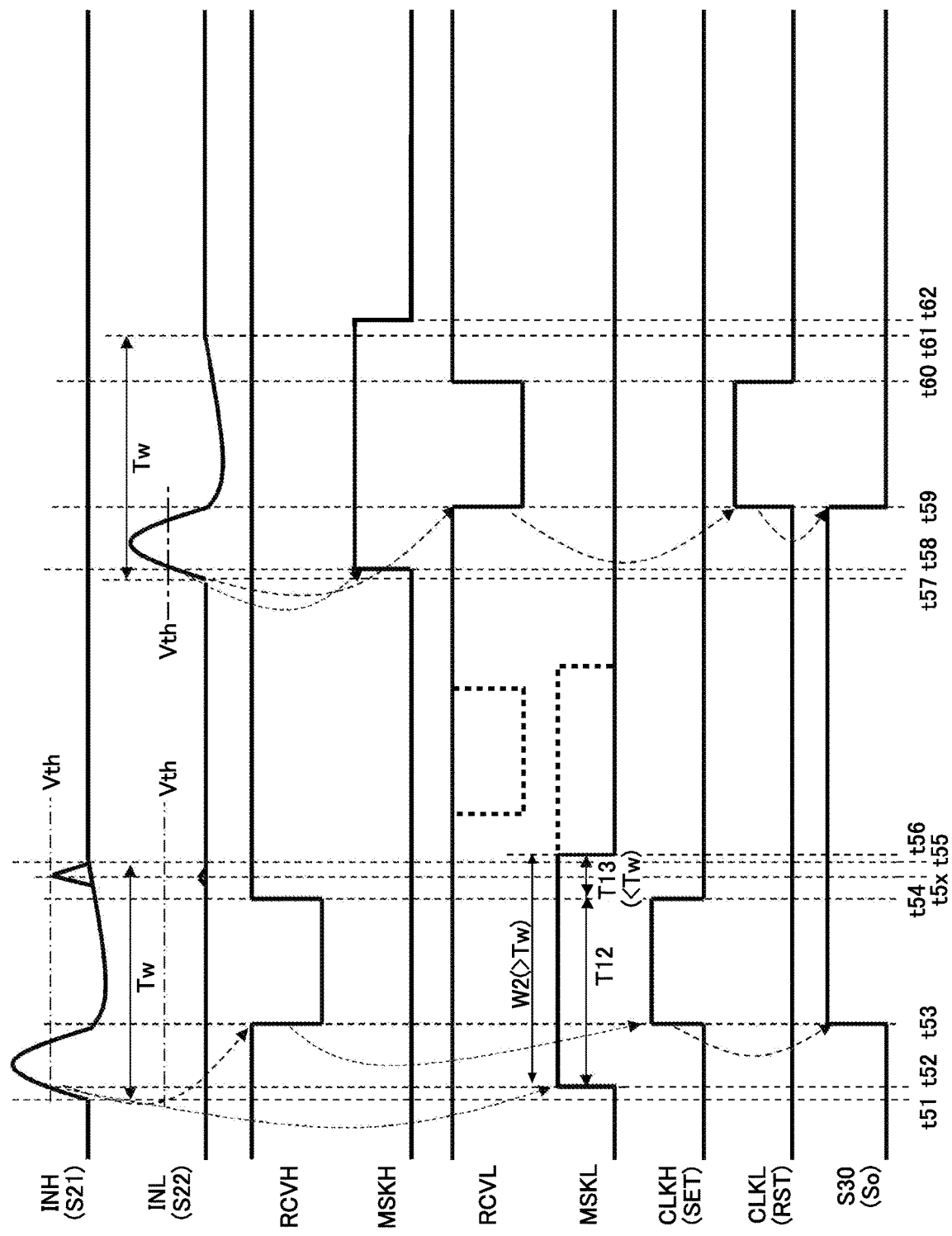
FIG. 17 is a timing chart showing an example of operation when noise occurs (with discharge transistors)

FIG. 17 is a timing chart showing an example of operation when in-phase noise occurs in a case where the discharge transistors 157 and 158 are introduced, depicting, like FIGS. 14 to 16, from top down, the input signals INH and INL (that is, the reception pulse signals S21 and S22), the reception signal RCVH, the mask signal MSKH, the reception signal RCVL, the mask signal MSKL, the clock signals CLKH and CLKL, and the reception pulse signal S30 (and hence the output signal So).

In FIG. 17, as in FIG. 15, while the input signal INH is being pulse-driven, during a period in which the input signal INH swings to a negative potential (at time point t5x), in-phase noise occurs.

Here, with a setting such that the mask signal MSKL has a pulse width W2 (=T12+T13) longer than the pulse duration Tw of the input signals INH and INL, even in the worst case as when in-phase noise occurs immediately before the expiration of the pulse duration Tw, it is possible to keep the mask signal MSKL at high level at the time point that the noise occurs.

When the mask signal MSKL is at high level, as mentioned previously, the input signal INL is discharged via the discharge transistor 158. As a result, the in-phase noise occurring in the input signal INL is discharged quickly to keep the input signal INL from exceeding the reception threshold value Vth, and thus no noise-induced pulse occurs in the reception signal RCVL. Accordingly, the reception signal RCVL no longer needs to be masked with the mask signal MSKL, and this makes it possible to shorten the delay time T13 and thereby reduce the pulse width W2 of the mask signal MSKL to the minimum necessary (T13<Tw<W2).

Figure 18:
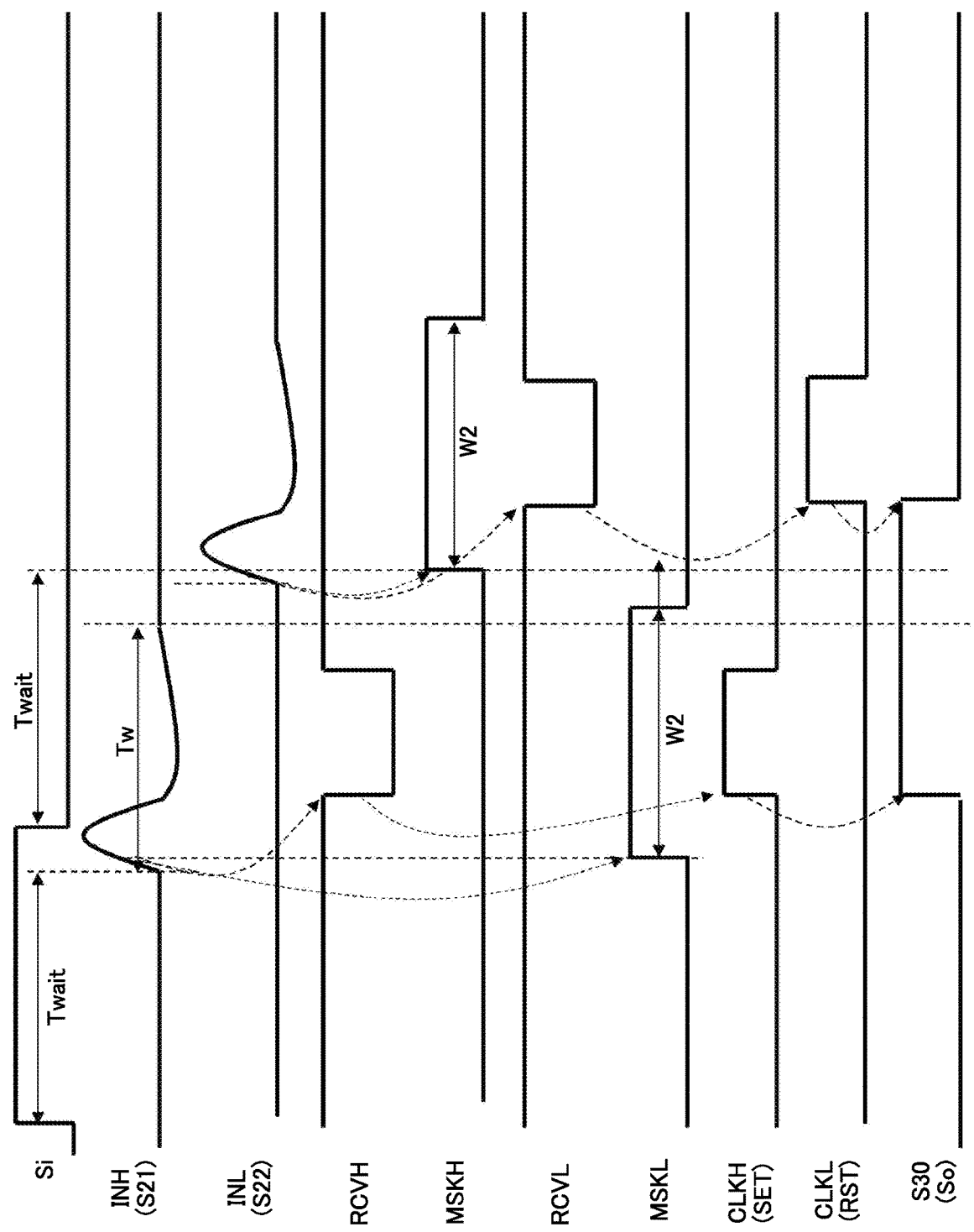
FIG. 18 is a timing chart showing an input minimum pulse width during regular operation.

FIG. 18 is a timing chart showing the input minimum pulse width during regular operation, depicting, from top down, the input signal Si, the input signals INH and INL (that is, the reception pulse signals S21 and S22), the reception signal RCVH, the mask signal MSKH, the reception signal RCVL, the mask signal MSKL, the clock signals CLKH and CLKL, and the reception pulse signal S30 (and hence the output signal So).

As mentioned previously, the pulse generation circuit 110 is subject to a restriction that requires that, after it pulse-drives one of the transmission pulse signals S11 and S12, at least until the masking period of the mask cancel circuit 150 (that is, the pulse width W2 of the mask signals MSKH and MSKL) elapses, it suspend the pulse-driving of the other of the transmission pulse signals S11 and S12. Thus, the transmission wait time Twait of the pulse generation circuit 110 (that is, the signal delay from detection of a pulse edge in the input signal Si to pulse-driving) is the shorter the smaller the pulse width W2 of the mask signals MSKH and MSKL.

Introducing the discharge transistors 157 and 158 makes it possible to reduce the pulse width W2 of the mask signals MSKH and MSKL and thereby achieve fast noise cancellation. It is thus possible to reduce the signal delay in the signal transfer device 100. Moreover, shortening the transmission wait time Twait makes it possible also to increase the driving frequency fsw of the switching output block 10.

Overview

To follow is an overview of the various embodiments disclosed herein.

First Aspect of the Invention: For example, in one arrangement according to what is disclosed herein, a pulse generation circuit includes: an edge detector block configured to detect a pulse edge in an input signal to generate a first edge detection signal and a second edge detection signal; a clock generator block configured to generate a clock signal according to the first and second edge detection signals; a frequency divider block configured to divide the frequency of the clock signal to generate a frequency-divided clock signal; a test input pad configured to receive a test mode switch signal from a tester; and a test output pad configured to output the frequency-divided clock signal to the tester. The edge detector block is configured to have a function of generating the first and second edge detection signals by detecting a pulse edge not in the input signal but in the clock signal or in the inverted clock signal obtained by inverting the logic level of the clock signal when the test mode switch signal is being fed in. The signal delay time in the edge detector block is adjustable according to the period of the frequency-divided clock signal as measured by the tester. (A first configuration.)

In the pulse generation circuit of the first configuration described above, there can be further provided a transmitter block configured to generate a first transmission pulse signal and a second transmission pulse signal according to the first and second edge detection signals. (A second configuration.)

In another arrangement according to what is disclosed herein, a signal transfer device includes: the pulse generation circuit of the second configuration described above; an isolation circuit configured to transfer the first and second transmission pulse signals as a first reception pulse signal and a second reception pulse signal, respectively, to the succeeding stage while isolating between input and output; a pulse reception circuit configured to generate a reception pulse signal according to the first and second reception pulse signals; and an output drive circuit configured to generate an output signal according to the reception pulse signal. (A third configuration).

In the signal transfer device of the third configuration described above, the pulse generation circuit can be integrated on a first semiconductor chip, the isolation circuit can be integrated on a second semiconductor chip, and the pulse reception circuit and the output drive circuit can be integrated on a third semiconductor chip. The first, second, and third semiconductor chips can be integrated in a single package. (A fourth configuration).

In the signal transfer device of the fourth configuration described above, the test input pad and the test output pad can be sealed in the package without being bonded to any lead frame. (A fifth configuration).

In another arrangement according to what is disclosed herein, a switching power supply includes the signal transfer device of any of the third to fifth configurations described above as a means for transferring a switching drive signal from a switching controller block to a switching output block while isolating between the switching controller block and the switching output block. (A sixth configuration).

In the switching power supply of the sixth configuration described above, the switching output block can include four transistors connected in a full bridge between the positive and negative terminals of a direct-current power source. The signal transfer device can be provided one between the switching controller block and the gate of each of the transistors. (A seventh configuration).

In the switching power supply of the seventh configuration described above, the four transistors can all be Si-MOSFETs, SiC-MOSFETs, or IGBTs. (An eighth configuration).

In the switching power supply of the eighth configuration described above, the switching output block can be driven at a frequency of 100 kHz or more. (A ninth configuration).

In the switching power supply of any of the sixth to ninth configurations, there can be further provided: a transformer that includes a primary winding connected to the switching output block and a secondary winding magnetically coupled with the primary winding; and a rectifier-smoother block configured to generate an output voltage from the induced voltage appearing in the secondary winding. (A tenth configuration).

With a signal transfer device according to what is disclosed herein, it is possible to suppress variation of signal delay.

Second Aspect of the Invention: For example, in another arrangement according to what is disclosed herein, a signal transfer device includes: a pulse generation circuit configured to generate a plurality of pulses in one of a first transmission pulse signal and a second transmission pulse signal according to the logic level of an input signal; an isolation circuit configured to transfer the first and second transmission pulse signals as a first reception pulse signal and a second reception pulse signal, respectively, while isolating between input and output; a noise cancel circuit configured to mask in-phase noise occurring in the first and second reception pulse signals to generate a first clock signal and a second clock signal; and a pulse reception circuit configured to count the numbers of pulses in the first and second clock signals, respectively, to switch the logic level of a reception pulse signal. The pulse reception circuit is configured to reset the number of pulses in the second clock signal according to the first clock signal and reset the number of pulses in the first clock signal according to the second clock signal. (An eleventh configuration).

In the signal transfer device of the eleventh configuration described above, the pulse reception circuit can include: an RS flip-flop configured to receive a set signal and a reset signal to output the reception pulse signal; a first counter configured to count the number of pulses in the first clock signal to output the set signal when the counted number reaches a predetermined value, the counted number being set back to the initial value when a pulse is generated in the second clock signal; and a second counter configured to count the number of pulses in the second clock signal to output the reset signal when the counted number reaches a predetermined value, the counted number being set back to the initial value when a pulse is generated in the first clock signal. (A twelfth configuration).

In the signal transfer device of the eleventh or twelfth configuration described above, the noise cancel circuit can include: a first reception signal generator block configured to generate a first reception signal according to the first reception pulse signal; a second reception signal generator block configured to generate a second reception signal according to the second reception pulse signal; a first mask signal generator block configured to generate a first mask signal according to the second reception pulse signal; a second mask signal generator block configured to generate a second mask signal according to the first reception pulse signal; a first logic gate configured to perform a logical operation between the first reception signal and the first mask signal to generate the first clock signal; and a second logic gate configured to perform a logical operation between the second reception signal and the second mask signal to generate the second clock signal. (A thirteenth configuration).

In the signal transfer device of the thirteenth configuration described above, the first reception signal generator block can be configured to generate the first reception signal with a first pulse width when a pulse is generated in the first reception pulse signal, and the second reception signal generator block can be configured to generate the second reception signal with the first pulse width when a pulse is generated in the second reception pulse signal. The first mask signal generator block can be configured to generate the first mask signal with a second pulse width larger than the first pulse width when a pulse is generated in the second reception pulse signal, and the second mask signal generator block can be configured to generate the second mask signal with the second pulse width when a pulse is generated in the first reception pulse signal. (A fourteenth configuration).

In another arrangement according to what is disclosed herein, in a signal transfer device, there can be further provided an output drive circuit configured to generate an output signal according to the reception pulse signal. (A fifteenth configuration).

With a signal transfer device according to what is disclosed herein, it is possible to reduce signal delay in a multiple transmission-reception system.

Third Aspect of the Invention: For example, in another arrangement according to what is disclosed herein, a noise cancel circuit includes: a first reception signal generator block configured to generate a first reception signal according to a first input signal; a second reception signal generator block configured to generate a second reception signal according to a second input signal fed in in parallel with the first input signal; a first mask signal generator block configured to generate a first mask signal according to the second input signal; a second mask signal generator block configured to generate a second mask signal according to the first input signal; a first logic gate configured to perform a logical operation between the first reception signal and the first mask signal to generate a first output signal; a second logic gate configured to perform a logical operation between the second reception signal and the second mask signal to generate a second output signal; a first discharge transistor configured to discharge the first input signal by using the first mask signal; and a second discharge transistor configured to discharge the second input signal by using the second mask signal. (A sixteenth configuration).

In the noise cancel circuit of the sixteenth configuration described above, the first reception signal generator block can be configured to generate the first reception signal with a first pulse width when the first input signal exceeds a threshold value, and the second reception signal generator block can be configured to generate the second reception signal with the first pulse width when the second input signal exceeds a threshold value. The first mask signal generator block can be configured to generate the first mask signal with a second pulse width larger than the first pulse width when the second input signal exceeds a threshold value, and the second mask signal generator block can be configured to generate the second mask signal with the second pulse width when the first input signal exceeds a threshold value. (A seventeenth configuration).

In the noise cancel circuit of the seventeenth configuration described above, the first and second reception signal generator blocks can each include a first delay stage configured to, after the input signal to it exceeds the threshold value, when a first delay time has elapsed, switches the output signal from it from the logic level during steady operation to the logic level during pulse generation and, after the input signal to it exceeds the threshold value, when a second delay time longer than the first delay time has elapsed, switches the output signal from it from the logic level during pulse generation to the logic level during steady operation, in order thereby to set the first pulse width equal to the difference between the first and second delay times. The first and second mask signal generator blocks can each include a second delay stage configured to, when the input signal to it exceeds the threshold value, without delay, switches an output signal from it from the logic level during no masking to the logic level during masking and, after the input signal to it exceeds the threshold value, when the second delay time and subsequently a third delay time have elapsed, switches the output signal from it from the logic level during making to the logic level during no masking, in order thereby to set the second pulse width equal to the sum of the second and third delay times. (An eighteenth configuration).

In the noise cancel circuit of the eighteenth configuration described above, the second pulse width can be longer than the pulse duration in the first and second input signals, and the third delay time can be shorter than the pulse duration. (A nineteenth configuration).

In the noise cancel circuit of the eighteenth or nineteenth configuration described above, the first and second discharge transistors can each be connected between the input terminal of the first delay stage included in the first and second reception signal generator blocks, respectively, and a grounded terminal. (A twentieth configuration).

In another arrangement according to what is disclosed herein, a signal transfer device includes: a pulse generation circuit configured to generate a first transmission pulse signal and a second transmission pulse signal according to an input signal; an isolation circuit configured to transfer the first and second transmission pulse signals as a first reception pulse signal and a second reception pulse signal, respectively, to the succeeding stage while isolating between input and output; the noise cancel circuit of any of the sixteenth to twentieth configurations described above configured to receive the first and second reception pulse signals as the first and second input signals, respectively, and output the first and second output signals as the first and second reception pulse signals having undergone noise cancellation;

a pulse reception circuit configured to generate a reception pulse signal according to the first and second reception pulse signals having undergone noise cancellation; and an output drive circuit configured to generate an output signal according to the reception pulse signal. (A twenty-first configuration).

With a signal transfer device according to what is disclosed herein, it is possible to achieve fast noise cancellation and thereby reduce signal delay.

Other Modifications

While the above-described embodiments deal with examples of application to isolated gate drivers used in switching power supplies, this is in no way meant to limit the application target of signal transfer devices according to what is disclosed herein. The present invention finds wide use generally in applications that involve transferring a signal while securing electrical isolation between input and output (motor drivers, isolators, and any other kinds of ICs and the like that handle high voltages).

The various technical features disclosed herein can be implemented in any manner other than specifically described by way of embodiments above, and allow for many modifications within the spirit of the technical ingenuity involved. For example, bipolar transistors and MOS field-effect transistors are mutually interchangeable, and the logic levels of the various signals can be inverted as desired. That is, it should be understood that the embodiments disclosed herein are in every aspect illustrative and not restrictive, and that the technical scope of the present invention is defined not by the description of embodiments given above but by the scope of the appended claims and encompasses any modifications in the sense and scope equivalent to those of the claims.

INDUSTRIAL APPLICABILITY

The invention disclosed herein finds application in, for example, isolated gate drivers used in switching power supplies.

The invention disclosed herein finds use generally in applications that involve transferring a signal while securing electrical isolation between input and output.

What is claimed is:

1. A pulse generation circuit comprising:
an edge detector block configured to detect a pulse edge in an input signal to generate a first edge detection signal and a second edge detection signal;
a clock generator block configured to generate a clock signal according to the first and second edge detection signals;
a frequency divider block configured to divide a frequency of the clock signal to generate a frequency-divided clock signal;
a test input pad configured to receive a test mode switch signal from a tester; and
a test output pad configured to output the frequency-divided clock signal to the tester,
wherein
the edge detector block is configured to have a function of generating the first and second edge detection signals by detecting a pulse edge not in the input signal but in the clock signal or in an inverted clock signal obtained by inverting a logic level of the clock signal when the test mode switch signal is being fed in, and
a signal delay time in the edge detector block is adjustable according to a period of the frequency-divided clock signal as measured by the tester.

2. The pulse generation circuit according to claim 1, further comprising:
a transmitter block configured to generate a first transmission pulse signal and a second transmission pulse signal according to the first and second edge detection signals.

3. A signal transfer device comprising:
the pulse generation circuit according to claim 2;
an isolation circuit configured to transfer the first and second transmission pulse signals as a first reception pulse signal and a second reception pulse signal, respectively, to a succeeding stage while isolating between input and output;
a pulse reception circuit configured to generate a reception pulse signal according to the first and second reception pulse signals; and
an output drive circuit configured to generate an output signal according to the reception pulse signal.

4. The signal transfer device according to claim 3, wherein
the pulse generation circuit is integrated on a first semiconductor chip,
the isolation circuit is integrated on a second semiconductor chip,
the pulse reception circuit and the output drive circuit are integrated on a third semiconductor chip, and
the first, second, and third semiconductor chips are integrated in a single package.

5. The signal transfer device according to claim 4, wherein
the test input pad and the test output pad are sealed in the package without being bonded to any lead frame.

6. A switching power supply comprising the signal transfer device according to claim 3, wherein
the signal transfer device is configured to serve to transfer a switching drive signal from a switching controller block to a switching output block while isolating between the switching controller block and the switching output block.

7. The switching power supply according to claim 6, wherein
the switching output block includes four transistors connected in a full bridge between positive and negative terminals of a direct-current power source, and
the signal transfer device is provided one between the switching controller block and a gate of each of the transistors.

8. The switching power supply according to claim 7, wherein
the four transistors are all Si-MOSFETs, SiC-MOSFETs, or IGBTs.

9. The switching power supply according to claim 8, wherein
the switching output block is driven at a frequency of 100 kHz or more.

10. The switching power supply according to claim 6, further comprising:
a transformer including
a primary winding connected to the switching output block and
a secondary winding magnetically coupled with the primary winding; and a rectifier-smoother block configured to generate an output voltage from an induced voltage appearing in the secondary winding.

* * * * *